(12) United States Patent
Bhunia et al.

(10) Patent No.: US 7,454,738 B2
(45) Date of Patent: Nov. 18, 2008

(54) SYNTHESIS APPROACH FOR ACTIVE LEAKAGE POWER REDUCTION USING DYNAMIC SUPPLY GATING

(75) Inventors: Swarup Bhunia, West Lafayette, IN (US); Nilanjan Banerjee, West Lafayette, IN (US); Hamid Mahmoodi, West Lafeyette, IN (US); Qikai Chen, West Lafayette, IN (US); Kaushik Roy, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 327 days.

(21) Appl. No.: 11/450,711

(22) Filed: Jun. 9, 2006

(65) Prior Publication Data

US 2007/0016808 A1    Jan. 18, 2007

Related U.S. Application Data

(60) Provisional application No. 60/689,265, filed on Jun. 10, 2005.

(51) Int. Cl.
*G06F 17/50*    (2006.01)
(52) U.S. Cl. ............................................. 716/18; 716/2

(58) Field of Classification Search ...................... 716/2, 716/4, 16, 18; 326/37; 327/524; 713/300
See application file for complete search history.

(56) References Cited

U.S. PATENT DOCUMENTS

| | | | | |
|---|---|---|---|---|
| 5,774,367 A * | 6/1998 | Reyes et al. | ..................... | 716/2 |
| 5,966,523 A * | 10/1999 | Uchino | ........................ | 703/2 |
| 6,785,870 B2 * | 8/2004 | Chen | ............................. | 716/2 |
| 7,051,306 B2 * | 5/2006 | Hoberman et al. | ............. | 716/6 |
| 7,082,582 B1 * | 7/2006 | Borkovic et al. | ............... | 716/3 |
| 7,100,144 B2 * | 8/2006 | Jacobson et al. | .............. | 716/18 |
| 7,334,198 B2 * | 2/2008 | Ditzel et al. | ................... | 716/1 |
| 2002/0062463 A1 * | 5/2002 | Hines | ......................... | 714/38 |
| 2003/0217350 A1 * | 11/2003 | Teig et al. | ..................... | 716/18 |
| 2005/0204319 A1 * | 9/2005 | Hanafi et al. | ................... | 716/4 |
| 2006/0129953 A1 * | 6/2006 | Jain | .............................. | 716/3 |
| 2006/0265681 A1 * | 11/2006 | Bakir et al. | .................. | 716/10 |

* cited by examiner

*Primary Examiner*—Stacy A Whitmore
(74) *Attorney, Agent, or Firm*—Bose McKinney & Evans LLP

(57) ABSTRACT

A logic synthesis method to apply supply gating to idle portions of general logic circuits in their active mode of operation to reduce power requirements and the circuits resulting therefrom. A Shannon expansion is utilized to determine idle portions and active portions of the general logic circuits.

15 Claims, 19 Drawing Sheets

SYNTHESIS APPROACH FOR ACTIVE LEAKAGE POWER REDUCTION USING DYNAMIC SUPPLY GATING

CROSS-REFERENCE TO RELATED APPLICATION

This application claims the benefit of U.S. Provisional Patent Application Ser. No. 60/689,265, filed Jun. 10, 2005, titled "Synthesis Approach for Active Leakage Power Reduction Using Dynamic Supply Gating", the disclosure of which is expressly incorporated by reference herein in its entirety.

TECHNICAL FIELD

The present invention relates generally to integrated circuit technologies, fabrication methods therefore and logic synthesis tools. More particularly, the present invention relates to a method to reduce active leakage power using supply gating in MOS device architectures.

BACKGROUND OF THE INVENTION

The current growth in the semiconductor industry has been driven by the aggressive scaling of the CMOS technology. In future CMOS technology generations, it is believed that supply and threshold voltages will continue to scale down to sustain performance demands, reduce switching power requirements and maintain device reliability. These continual scaling requirements of supply and threshold voltages combined with increasing integration density pose several technology and circuit design challenges. Since subthreshold leakage current increases exponentially with reduction in threshold voltage and temperature increase (due to increased device density), leakage power can become a major fraction of total power in the active mode. Therefore, there is a growing necessity to develop system-level techniques to counter this increment in leakage power.

SUMMARY OF THE INVENTION

Pursuant to one aspect of the present invention, there is provided a method to control the amount of power used by one or more combinational logic circuits implementing one or more logic functions. The method includes the steps of: converting the logic function to a sum of at least two sub-functions to determine an idle portion of the logic circuit and an active portion of the logic circuit, providing a logic circuit including the idle portion and the active portion, disconnecting the power from the idle portion of the circuit, and supplying power to the active portion of the circuit while the power is disconnected from the idle portion of the circuit.

Pursuant to another aspect of the present invention there is provided a method of providing a combinational logic circuit implementing a logic function, the circuit including a reduced power requirement. The method includes the steps of optimizing the logic function, converting the optimized logic function to a two-level format, identifying a control variable, a first cofactor, and a second cofactor from the two level format; mapping the first cofactor to provide a first logic circuit including a first output, mapping the second cofactor to provide a second logic circuit including a second output, and coupling the first output and the second output to a selector, to select from one of the first and second outputs.

DETAILED DESCRIPTION

Figure 1:
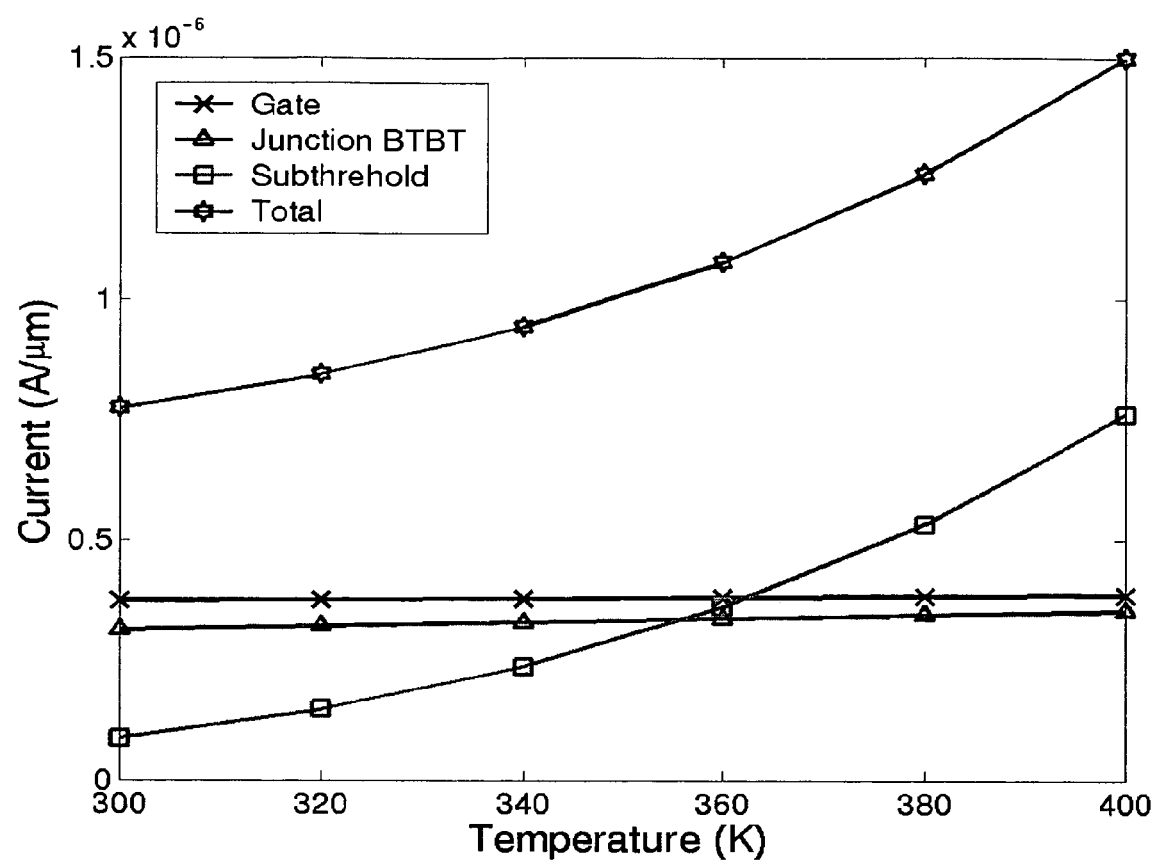
FIG. 1 is a diagram of different leakage currents vs. temperature for a 50 nm NMOS device.

For the purposes of promoting and understanding the principals of the invention, reference will now be made to the embodiments illustrated in the drawings and specific language will be used to describe the same. It will nevertheless be understood that no limitation of the scope of the invention is thereby intended, such alterations and further modifications in the illustrated device(s) and methods, and such further applications of the principals of the invention as illustrated therein being contemplated as would normally occur to one skilled in the art to which the invention relates.

A cost effective design methodology for reducing both switching and active leakage power using dynamic supply gating is described. A logic synthesis approach based on Shannon expansion is also described that dynamically applies supply gating to idle parts of a general logic circuit, even when other parts of the general logic circuit are performing useful computation. Experimental results on a set of MCNC benchmark circuits in predictive 70 nm process exhibit improvements of approximately 8% to 65% in total active power (with minimal area overhead and delay penalty) compared to the results obtained by a conventional optimization flow.

As CMOS technology continues to scale down to achieve higher performance and higher level of integration, power dissipation is becoming a potential barrier to further scaling. The power dissipation is due to both switching and leakage current and is given by:

$$P = P_{switching} + P_{leakage} = \alpha \cdot f \cdot C \cdot V_{dd}^2 + I_{leakage} \cdot V_{dd} \quad (1)$$

where, $V_{dd}$ is supply voltage, $\alpha$ is switching activity, f is the clock frequency, C is the average switched capacitance of the circuit, and $I_{leakage}$ is the average leakage current. The switching power is due to charging and discharging of circuit capacitances, and therefore, is directly proportional to the switching activity and frequency. Leakage power in bulk scaled technologies is mainly due to subthreshold leakage, gate leakage, and reverse-biased source-substrate and drain-substrate junction tunneling leakage (JT) because of halo implants. Subthreshold leakage increases exponentially as the technology scales because of reduced threshold voltages ($V_t$) required to maintain transistor 'ON' current at reduced supply voltages. Gate leakage increases exponentially because of reduced oxide thickness required to maintain the gate control over the channel to reduce short channel effects. The reverse biased junction tunneling increases because of increased doping levels used in the halo implants to suppress Drain Induced Barrier Lowering (DIBL) and $V_t$ roll-off. Hence, leakage power is becoming a significant fraction of total power dissipation. Leakage is not only important in the standby mode but also in the active mode of operation. In fact, the leakage in the active mode (active leakage) is significantly larger due to higher die temperature in the active mode and the exponential temperature dependence of subthreshold leakage.

FIG. 1 shows the temperature dependence of different leakage components in a predictive 50 nm process. Gate leakage is not temperature dependent, whereas, JT leakage is weakly dependent on temperature. Therefore, in the active mode of operation (high temperature), subthreshold leakage is the dominant component of leakage. Experiments on high performance microprocessors show that more than 40% of the total power dissipation is due to leakage (both active and standby leakage). A low-power design methodology in scaled technologies, therefore, can target both the switching and leakage components of power in the active mode of operation.

Dual $V_t$ assignment has been used as a static method for reducing the leakage power. However, dual $V_t$ technique does not typically reduce the leakage on critical paths. Moreover, dual $V_t$ assignment typically increases the number of critical paths in a design, degrading the design yield under process variations.

In dynamic leakage reduction methods, the known leakage reduction techniques are applied only in the standby mode. These methods include input vector control, dynamic body biasing, and supply gating. Input vector control uses the state dependence of leakage to apply best input vector to the circuit in the standby mode. However, input vector control can sometimes be ineffective because it may not be possible to force all logic gates to their best leakage state by controlling the state of primary inputs. Dynamic body biasing applies forward (or zero) body bias in the active mode to achieve high performance and an optimal reverse body bias in the standby mode to minimize leakage. The effectiveness of this approach reduces with technology scaling since the optimal reverse body bias becomes closer to zero body bias as technology scales. Moreover, body bias does not reduce gate leakage. Dual-VDD and dynamic voltage scaling are used for power reduction without impacting system performance. However, dual-VDD requires extra supply voltage and is not applicable in performance critical circuits. Dual-VDD also results in more critical paths in a design, which adversely affects the design yield under parameter variations. Dynamic voltage scaling suffers from large energy and transition delay overhead for changing the supply voltage. Supply gating has been proposed as a method to reduce standby leakage current. The idea is to disconnect the global supply voltage of the circuit in the standby mode when the circuit is not performing any useful computation.

The above-mentioned dynamic leakage reduction methods cannot be applied in the active mode since the circuit is required to do computation at a target speed. However, it has been observed by the inventors that considerable portions of circuits can be idle for periods of time even in the active mode of operation. Therefore, there exists opportunities for dynamic application of leakage reduction techniques in the active mode as well.

A low-overhead design methodology for efficiently reducing active leakage power using supply gating is described herein. In addition, the proposed method(s) reduce switching power by preventing redundant switching in idle parts of a circuit. We also propose a synthesis methodology based on Shannon expansion to provide opportunities for supply gating in the active mode for general combinational circuits. The proposed method(s) result(s) in automatic savings in standby leakage because of stacking. In addition, circuits incorporating aspects of the present invention are also described.

A circuit synthesis technique to reduce active power (both switching and leakage) using supply gating.

Extension of supply gating for power reduction in active mode to general logic circuits using Shannon expansion based synthesis method.

Sizing of supply gating transistors for minimal impact on performance while maximizing power reduction. A pre-computation based technique for hiding the delay of control signal generation for supply gating transistors is also proposed.

1. Supply Gating for Reducing Active Power

Assuming that part of a circuit is identified to be idle in the active mode, redundant switching in that part of the circuit results in wasted switching power in addition to leakage power. By applying supply gating to that portion of the circuit, both components of the wasted power can be reduced. Supply gating can prevent propagation of signal activities from primary inputs to the intermediate and output nodes of the idle circuit.

Figure 2:
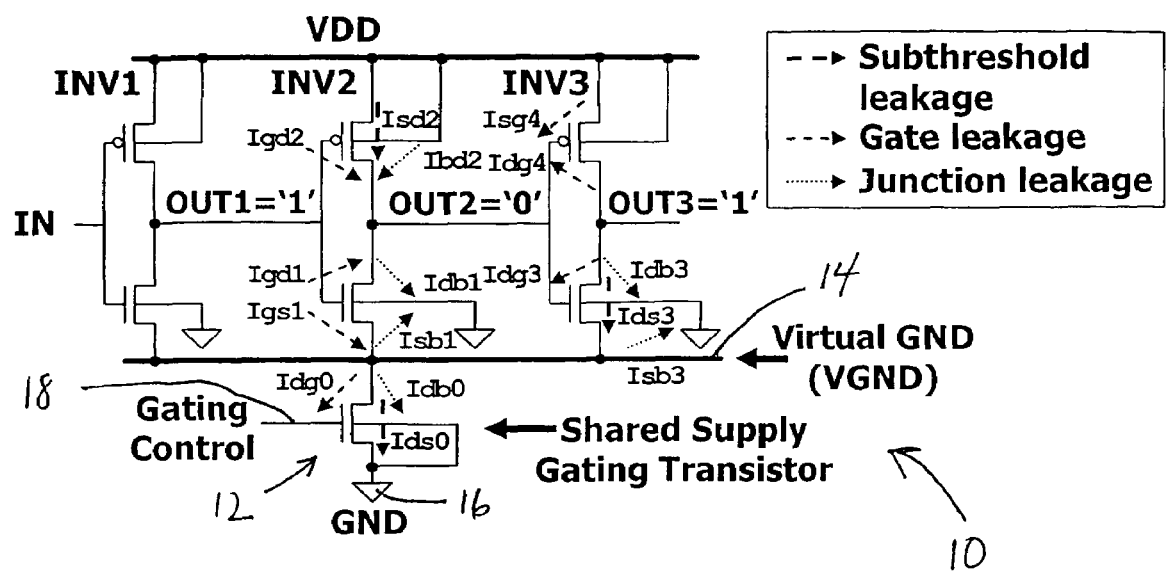
FIG. 2 illustrates supply gating for prevention of input switching propagation and leakage reduction applied to an inverter chain.

FIG. 1 illustrates different components leakage vs. temperature for supply gating applied to an inverter chain 10, as illustrated in FIG. 2. In the inverter chain circuit, supply gating is implemented using an NMOS transistor 12 that controls the connection of the virtual ground (VGND) node 14 to the real ground 16 (GND). The transistor 12 includes a gating control input 18 to control the inducting in leakage amount as follows: In supply gated mode (Gating Control='0'): if OUT1='1'→V(OUT1)=V(OUT3)=$V_{dd}$ and V(OUT2)=V(VGND)≈$V_{dd}$-$V_t$. In the supply gated mode, due to circuit leakage, the voltage of the virtual ground node 14 reaches an intermediate voltage level, resulting in stacking effect for leakage reduction. In addition to significant reduction in leakage current, supply gating prevents redundant switching in the idle blocks.

To understand the impact of supply gating on overall and individual components of leakage, two inverters in two different states (INV2 and INV3) are illustrated in FIG. 2 and include different components of leakage currents in the supply gated mode. The different components of leakage and the direction of current flow in each logic gate depend on the state of the logic.

Figure 3A:
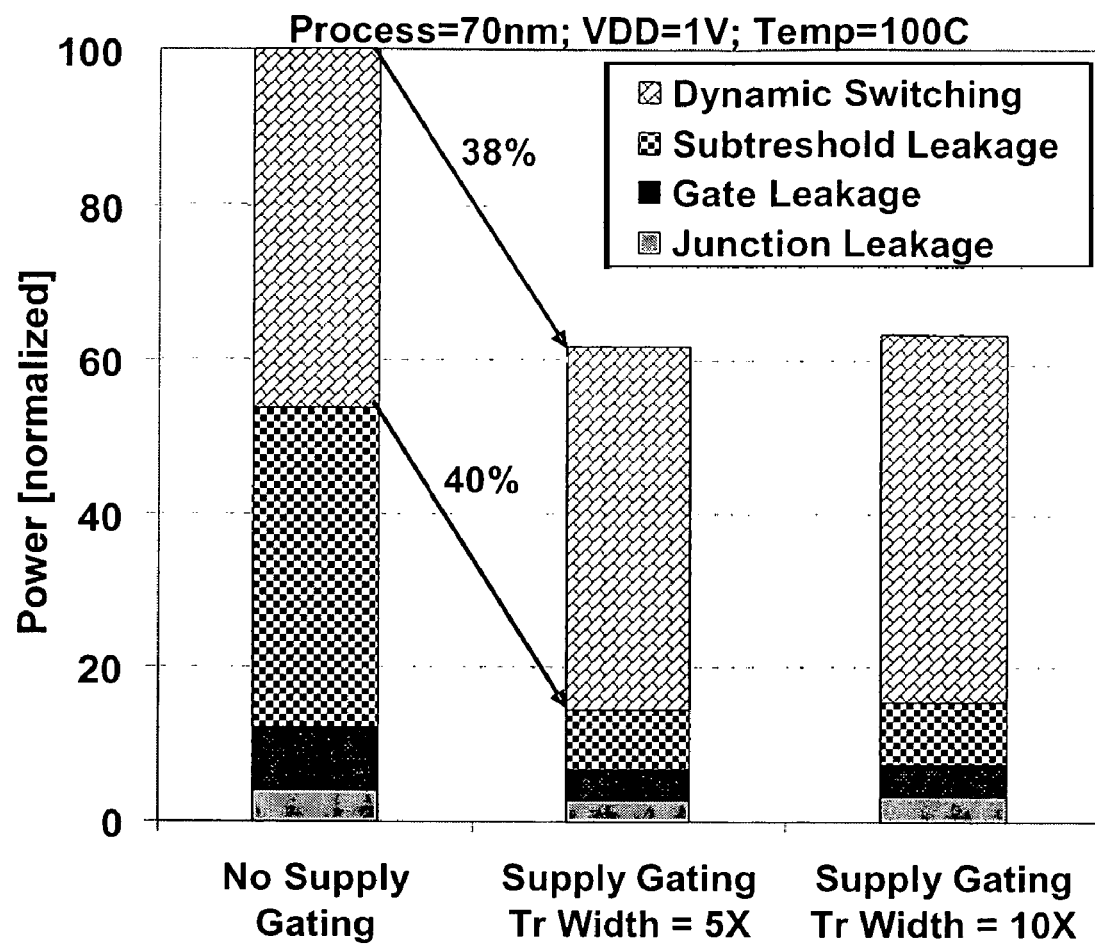
FIG. 3(a) illustrates the effectiveness of supply gating for power reduction in a 70 nm process.
Figure 3B:
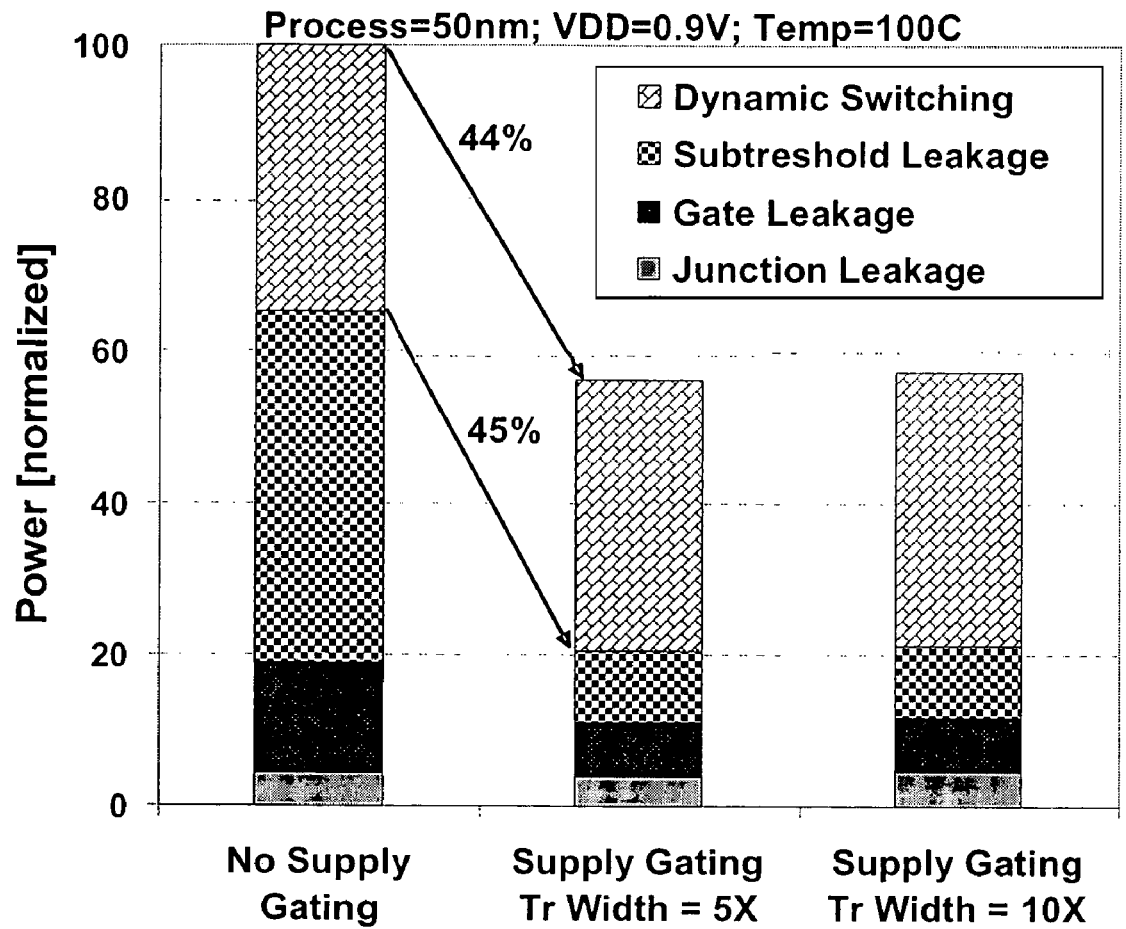
FIG. 3(b) illustrates the effectiveness of supply gating for power reduction in a 50 nm process.

The detailed leakage components are illustrated in FIG. 3 for this state of the circuit in two processes (70 nm and 50 nm). The leakage breakdown of the circuit (INV2 and INV3)

with and without supply gating is also shown in FIG. 3. Dynamic switching power is added to obtain the total power. Dynamic switching power is measured in the active mode for a frequency of 1 GHz and input switching activity of 20%. In the supply gated case, two sizes of the supply gating transistors are considered: 5 times the minimum size (5×) and 10 times the minimum size (10×). In the circuit without supply gating, the subthreshold leakage is the dominant component of leakage (more than 50% and 60% of total in 70 nm and 50 nm). By supply gating, the subthreshold leakage is reduced, and in some instances dramatically, due to the stacking effect (negative Vgs and body effect on the OFF NMOS transistors). The overall gate leakage is reduced because of a smaller voltage drop across gate oxides of transistors due to the raised virtual ground voltage (reduction in the effective voltage drop across the supply lines of the circuit: VDD and VGND). The reverse biased junction tunneling leakage is not affected much by supply gating because voltage drop across some junctions decreases (Ibd2), whereas voltage drop across some other junctions increases (Idb1 and Isb1). Since the overall leakage is dominated by subthreshold (and gate leakage in such a scaled technology), supply gating remains an effective method for total leakage reduction. Another observation from FIG. 3 is that the overall leakage in the supply gated mode is weakly dependent on the size of the supply gating transistor. There is a slight increase in leakage by upsizing the supply gating transistor due to small increase in each component of leakage. The switching power in the active mode is insignificantly affected by the supply gating. However, due to reduction in the leakage, there is an overall power reduction of approximately 38% and 44% in total power in 70 nm and 50 nm nodes, respectively. The result clearly shows the effectiveness of supply gating in scaled technologies.

Figure 4:
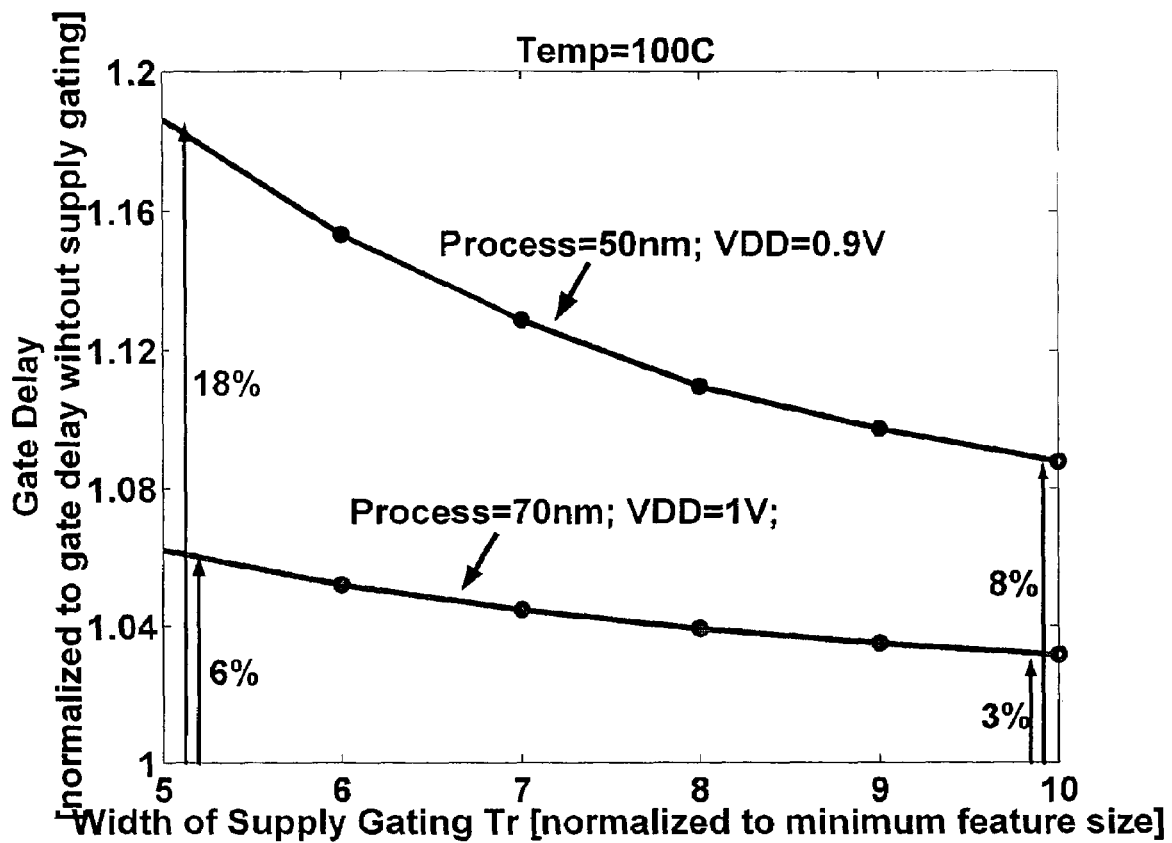
FIG. 4 illustrates the effect of supply gating on delay.

As illustrated in FIG. 4, it can be seen that the delay reduces by upsizing the supply gating transistor. In 70 nm, supply gating has a delay overhead of approximately 6% to 3% as the size of the supply gating transistor varies from 5× to 10×. The delay overhead can be reduced by increasing the supply voltage. However, high voltage reduces the power savings of the supply gating technique.

Figure 5A:
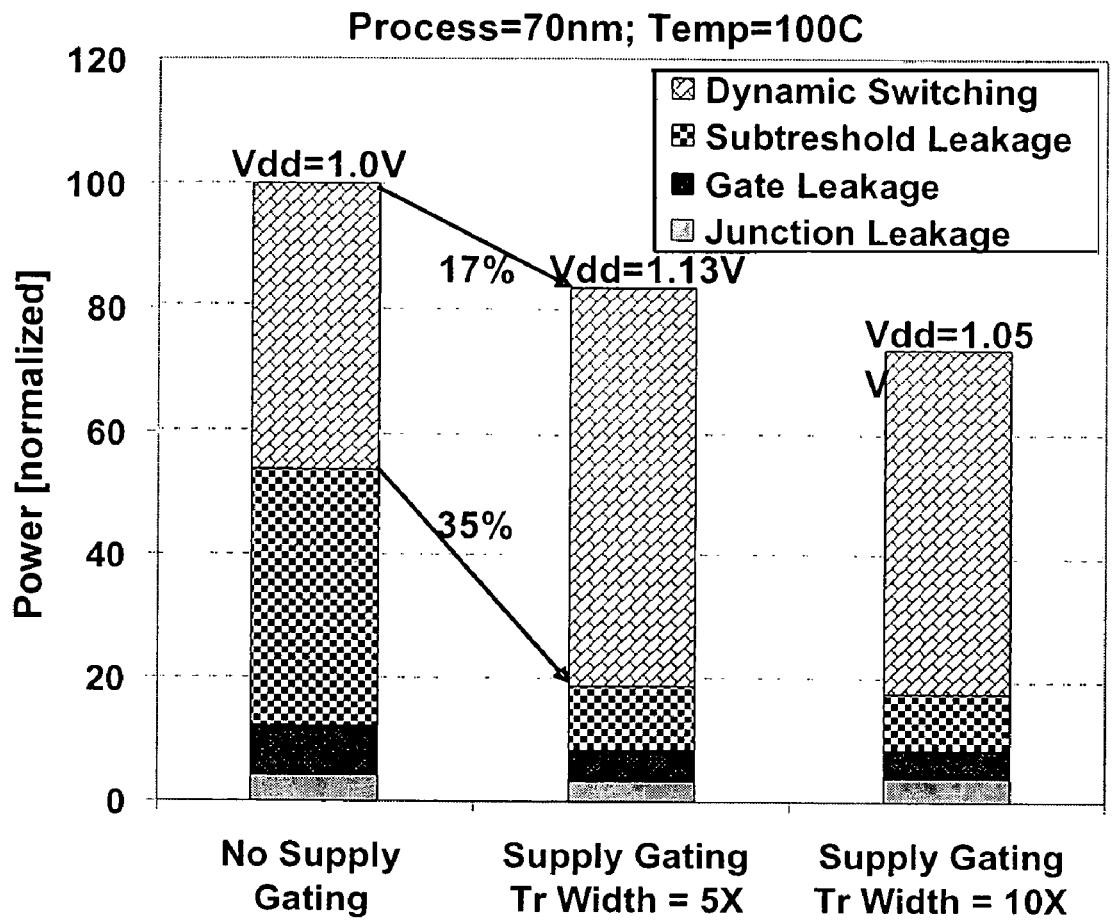
FIG. 5(a) illustrates the effect of power reduction by supply gating at iso-delay for a 70 nm process.
Figure 5B:
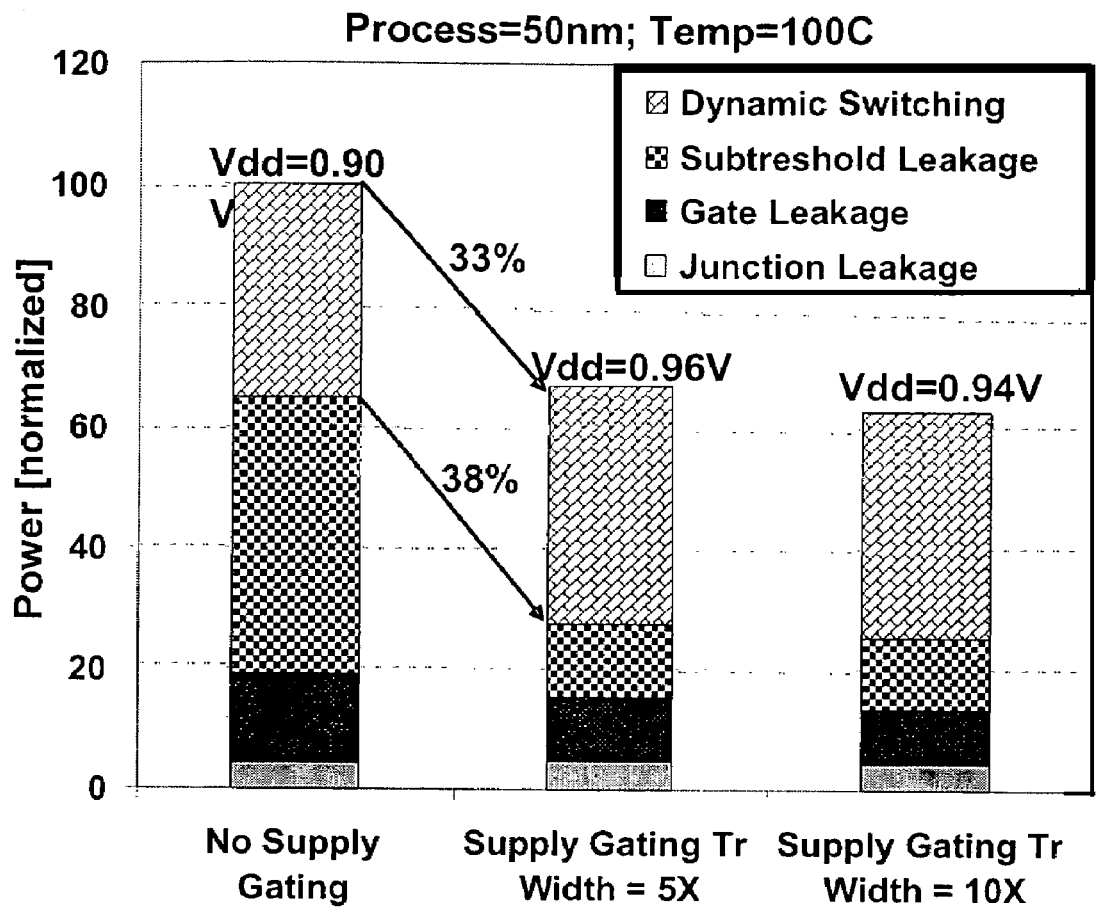
FIG. 5(b) illustrates the effect of power reduction by supply gating at iso-delay for a 50 nm process.

FIG. 5 illustrates an iso-delay comparison of power dissipation between the original design (no supply gating) and the design with dynamic supply gating. By increasing the supply voltage of the supply gated circuit, the delay penalty can be substantially avoided. In that case, the power saving reduces mainly due to increase in the dynamic switching power. However, the overall power still remains less than the original design. Under iso-delay voltage scaling, the supply gated circuit shows power reduction of approximately 17% and 33% in 70 nm and 50 nm process, respectively. Another interesting observation from FIG. 5 is that by upsizing the supply gating transistor, the required supply voltage for maintaining the delay is reduced and hence, more power reduction is achieved under iso-delay.

Since the delay improvement becomes marginal beyond the size of 10× for the supply gating transistor, this size has been selected for the supply gating transistor in the current designs. It is, however, within the scope of the present invention to select other sizes. In an actual circuit, all the logic gates do not switch simultaneously. Therefore, by sharing the supply gating transistor, the sizing of the shared transistor can be reduced. The following rule for sizing the shared supply gating transistor has been used. Assuming half of the logic gates in a circuit switch at a time (statistically speaking), the size (width) of a shared supply gating transistor is given by:

$$W = (10 \times L_{min}) \times (n/2) \quad (2)$$

Where, n is the total number of logic gates in the circuit and $L_{min}$ is the minimum feature size in a given process technology. If further delay reduction is required, the size of the supply gating transistor can be increased without much impact on leakage reduction (See FIG. 3).

2. A Circuit Example: Active Leakage Reduction in Memory Address Decoder

It has been found that supply gating for active leakage reduction can be applied to circuits with a tree structure. A memory address decoder is used as an example to explain the power reduction capability of the supply gating technique in the active mode. In address decoders, the switching activity of logic gates is low, especially for the final buffers, which drive the global word line (WL). Furthermore, to drive the global WL, which has a large capacitance, large buffers are used. In scaled technologies, such large buffers can dissipate significant leakage power.

A row address decoder can consist of pre-decoders, final-decoders, and WL drivers. The decoder structure shows that considerable portions of the circuit can be inactive during regular operations. By using the output of the pre-decoder, it is possible to turn off (by supply gating) certain parts of the final decoder, thereby, achieving active leakage saving in the logic gates of the idle blocks.

Figure 6:
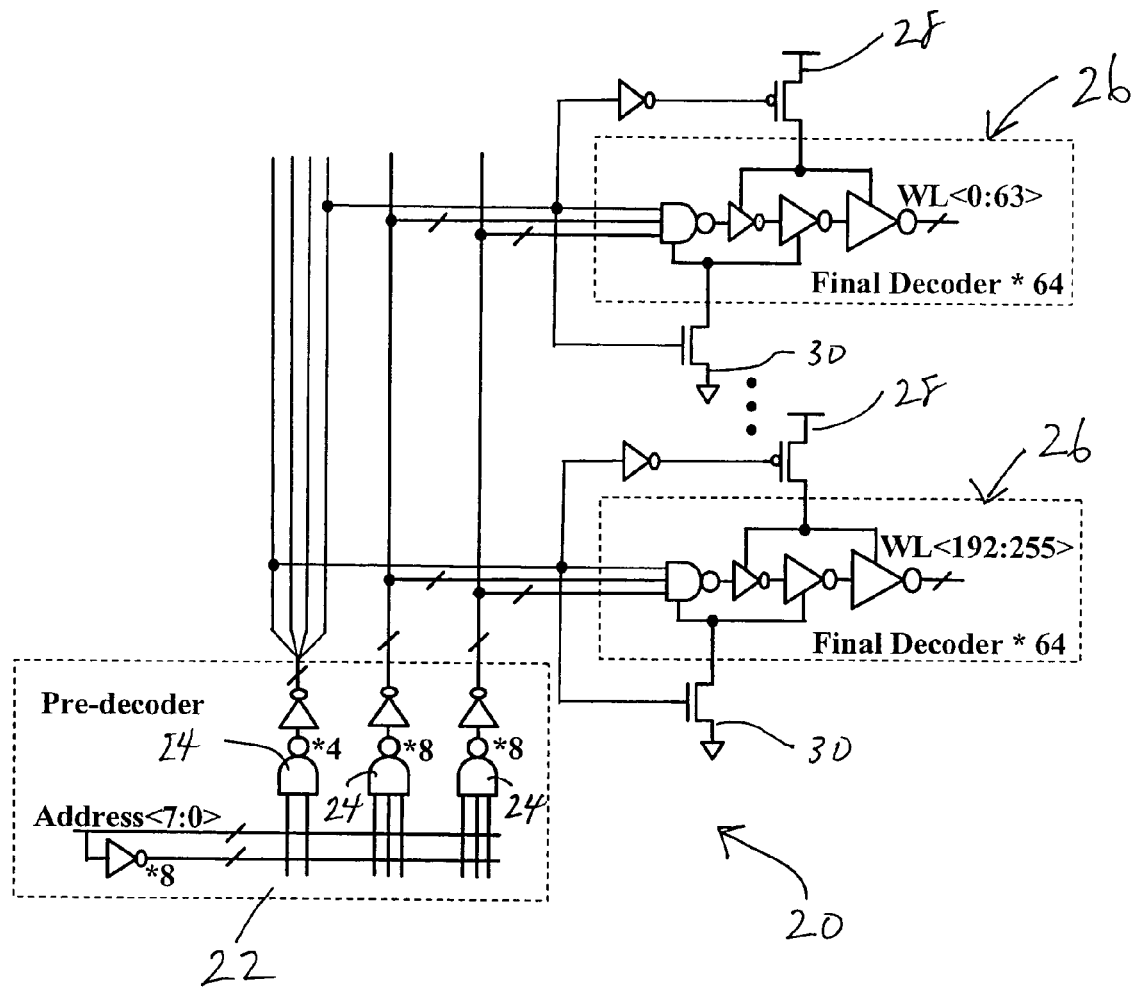
FIG. 6 illustrates an 8-bit row decoder with supply gating.

FIG. 6 illustrates an 8-bit row decoder 20 with supply gating based active leakage management. As shown in FIG. 6, the most significant bits of the row address are fed into a predecoder 22 having a plurality of NAND gates 24. The output of NAND gates 24 are coupled to one or more final decoders 26 together with the outputs of the other pre-decoder gates as in the conventional design. Moreover, the output of the NAND gates 24 turns on or off one or more supply gating transistors 28 and 30 to activate (enable) or deactivate (disable) certain blocks of the final decoders 26. In FIG. 6, the WL drivers are selectively gated to GND or VDD. This is due to the fact that a floating WL will reduce the memory cell stability. Hence, the voltage of a WL has to be stable at zero if it is not accessed. Moreover, the supply gating transistors, 28 and 30, can be shared among all the final decoding logic controlled by the same output of a NAND gate 24. This is due to the fact that, even in the active mode, only one path in these blocks is triggered.

Figure 7:
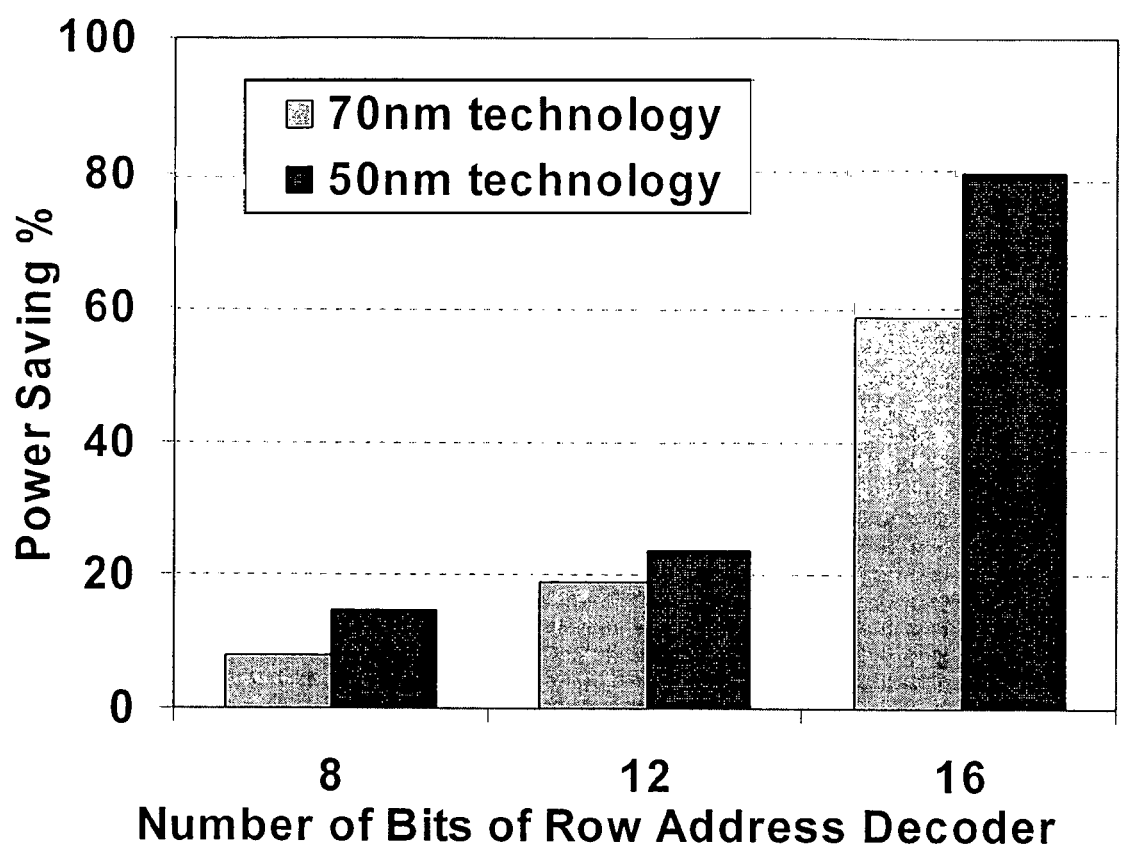
FIG. 7 illustrates a power saving by dynamic supply gating in decoders.

FIG. 7 shows the percentage of improvement in total power dissipation which can be achieved by dynamic supply gating in decoders designed in 70 nm and 50 nm nodes. As the size of the decoder (number of bits) increases, the power savings can increase considerably. This is due to the fact that the number of final decoders increases exponentially with the increase in the number of bits. For such a situation, the total power of row address decoders is dominated by the leakage of the logic gates in the final decoders. FIG. 7 also shows that there is more power reduction in 50 nm than 70 nm processes. Hence, the effectiveness of the dynamic supply gating for active leakage power reduction improves with technology scaling.

The overhead of supply gating in row address decoders is minimal. Since the output of the pre-decoder is used to control the gating transistors, the gating transistors are turned on by the time the inputs propagate to the final decoder. Therefore, the delay of turning on the supply gating transistors is hidden by the pre-decoder delay. We observe that the delay overhead is approximately 9% of the total decoder delay for both 70 nm and 50 nm technologies. Since the gating transistors are shared, the area overhead is very low (approximately 1.3% of the decoder area).

3. Active Leakage Reduction in General Logic Circuits: A Synthesis Technique Based on Shannon Expansion The principle of supply gating previously described can be extended and includes a synthesis flow for application of dynamic supply gating to general combinational circuits. The synthesis technique should distinguish between the active logic gates and the idle ones during the active mode of operation and dynamically apply supply gating to the idle gates without causing any final output node to get a floated state. Such a synthesis approach using Shannon expansion is described below.

3.1. Dynamic Supply Gating (DSG) Scheme using Shannon Expansion

Figure 8A:
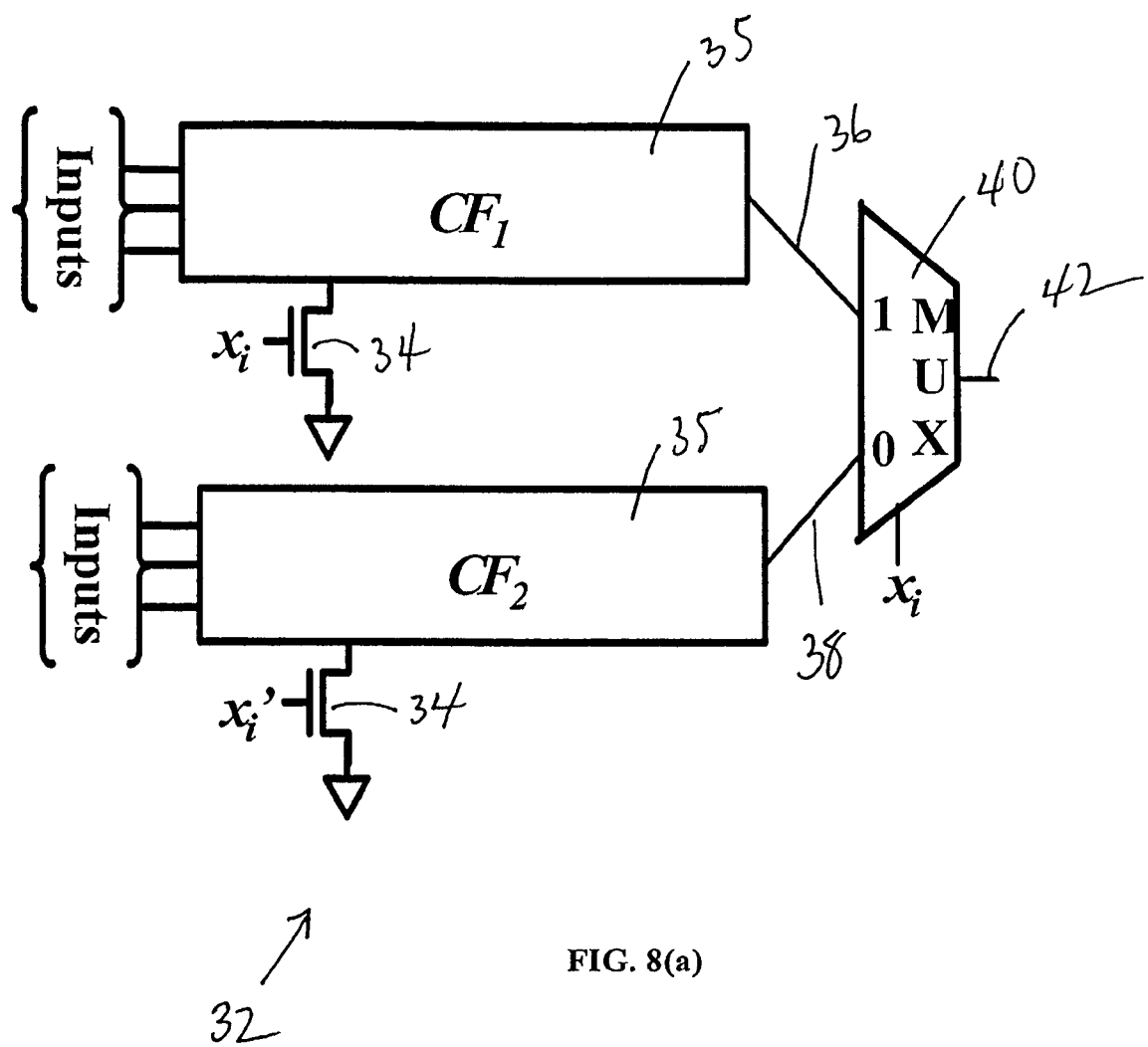
FIG. 8(a) illustrates one embodiment of dynamic supply gating based on Shannon expansion.

Shannon expansion has been used in logic synthesis for logic simplification and optimization. The Shannon expansion can be used to generate a Boolean function as the sum of two sub-functions of the original. It partitions any Boolean expression into disjoint sub-expressions as shown below:

$$f(x_1, \ldots, x_i, \ldots, x_n) = x_i \cdot f(x_1, \ldots, x_i = 1, \ldots, x_n) +$$
$$x_i' \cdot f(x_1, \ldots, x_i = 0, \ldots, x_n)$$
$$= x_i \cdot CF_1 + x_i' \cdot CF_2$$

$$CF_1 = f(x_1, \ldots, x_i = 1, \ldots, x_n);$$
$$CF_2 = f(x_1, \ldots, x_i = 0, \ldots, x_n)$$

where, $x_i$ is called the control variable, and $CF_1$ and $CF_2$ are called cofactors. From the above expression, it is clear that depending on the state of the control variable ($x_i$), the computed output of only one of the cofactors ($CF_1$ or $CF_2$) is required at any given instant. Consequently, the other cofactor provides redundant computation and therefore leakage current can result at any time. Therefore, gating the supply of the idle cofactor circuit can produce or eliminate its redundant computation and leakage energy. The Shannon theorem is used to identify the active/idle parts of a circuit for dynamic supply gating (DSG). A DSG scheme or circuit 32 of the present invention using Shannon expansion is illustrated in FIG. 8(a). One or more supply gating transistors 34 of circuits 35 for cofactors $CF_1$ and $CF_2$ are controlled by respective transistors 34 through input lines receiving symbols corresponding to control variables $x_i$ and $x_i'$, respectively. The output 36 of $CF_1$ and the output 38 of $CF_2$ are merged using a multiplexer 40 (MUX) controlled by input variable $x_i$. The MUX 40 directs the output of the active cofactor to a final output 42.

3.2. Areas of Optimization

Further reduction of power dissipation can be achieved in the DSG scheme of the present invention. The Boolean function itself is initially optimized to minimize the number of literals before applying the Shannon expansion. This optimization provides that the derived cofactors from the Shannon expansion are also optimized for minimal area and therefore power. Let us consider the following Boolean function $f$:

$$f = x_1'x_2 + x_1x_2' + x_1x_4x_5x_6 + x_1'x_3x_5x_6 +$$
$$x_1'x_7x_8 + x_7x_8x_9x_{10}x_{11} + x_1'x_{10}x_{11} + x_1x_5x_6 + x_4x_7x_8$$

After initial optimization, the following optimized function is obtained ($f_{opt}$):

$$f_{opt} = x_1'x_2 + x_1x_2' + x_1x_5x_6 + x_1'x_3x_5x_6 +$$
$$x_1x_7x_8 + x_7x_8x_9x_{10}x_{11} + x_1'x_{10}x_{11} + x_4x_7x_8$$

Figure 8B:
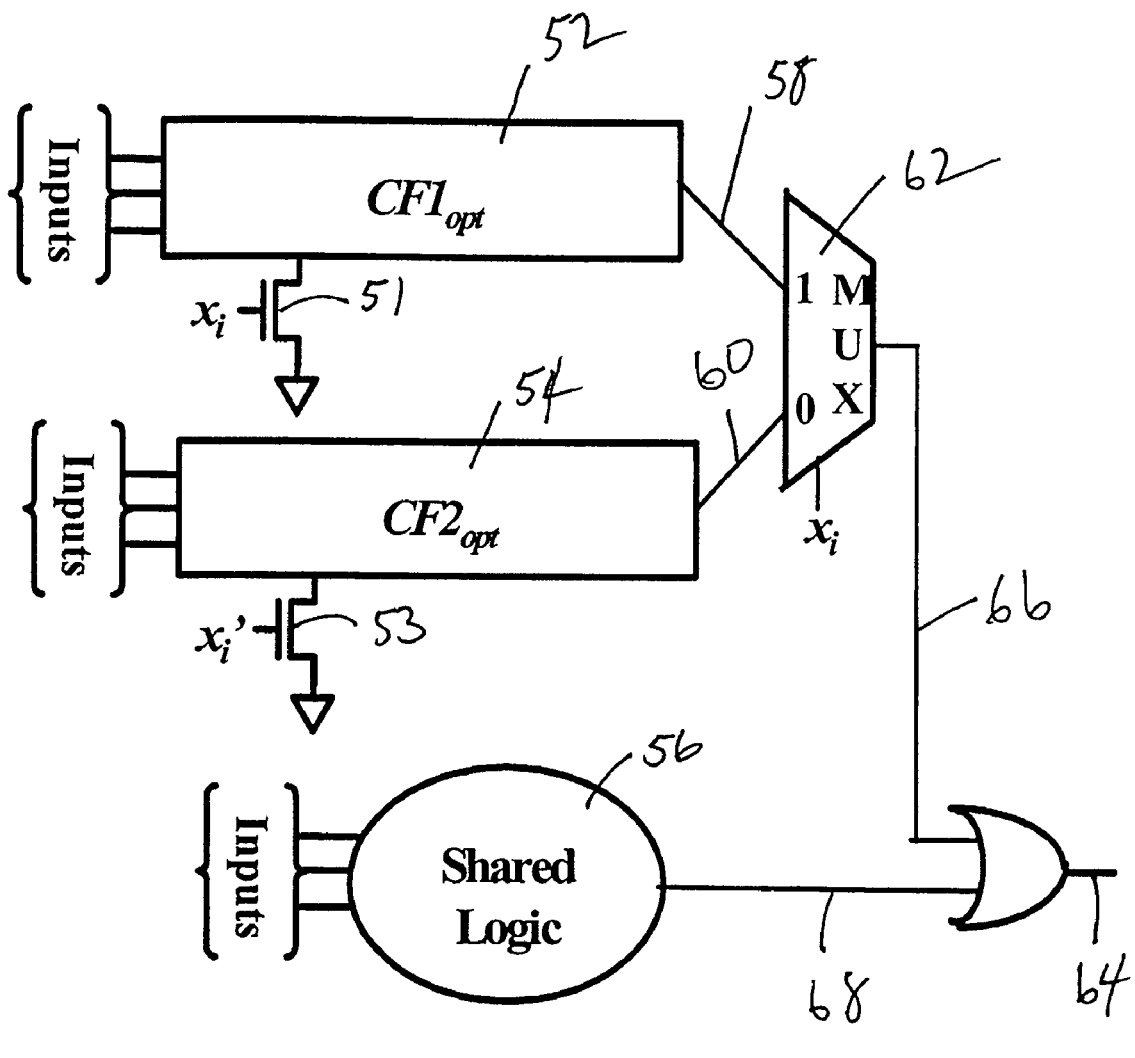
FIG. 8(b) illustrates another embodiment of dynamic supply gating with sharing among minterms based on Shannon expansion.

An optimized Boolean function can contain minterms that do not include the control variable. These minterms can be included in each of the cofactors determined by the Shannon expansion. This would involve duplication of the same logic realization of these minterms, which is not desirable in terms of area and leakage. Therefore, to minimize area overhead, it is better to include them as a separate shared logic (SL) circuit common to both the cofactors. However, the shared logic cannot be supply gated because its computation is required irrespective of the state of the control variable. Therefore, the optimal strategy is to choose a control variable that would minimize the shared logic. In the above example, the optimal control variable is $x_1$, as it appears in the largest number of minterms (minimizes the shared logic). The cofactors determined by the Shannon expansion are as follows:

Control Variable=$x_1 \Rightarrow$ $CF1 = x_2' + x_5x_6 + x_7x_8 + x_7x_8x_9x_{10}x_{11} + x_4x_7x_8$ $CF2 = x_2 + x_3x_5x_6 + x_{10}x_{11} + x_7x_8x_9x_{10}x_{11} + x_4x_7x_8$ The last two minterms of CF1 and CF2 are common because they are the minterms of $f_{opt}$ that do not contain $x_1$. Therefore, those two minterms are implemented as a shared logic (SL) as follows:

$f_{opt} = x_1 \cdot CF1opt + x_1' \cdot CF2opt + SL$ $CF1opt = x_2' + x_5x_6 + x_7x_8$ $CF2opt = x_2 + x_3x_5x_6 + x_{10}x_{11}$ $SL = x_4x_7x_8 + x_7x_8x_9x_{10}x_{11}$ The circuit 50 embodying the above expression with DSG is illustrated in FIG. 8(b). An output 58 of circuit 52 and an output 60 of circuit 54 are coupled to respective inputs of a multiplexer 62 (MUX). A final output on an output line 64 is generated by OR-ing a MUX output 66 and an output 68 of the shared logic 56. Supply gating transistors 51 and 53 of a first circuit 52 and a second circuit 54 respectively, realizing cofactors CF1opt, CF2opt, and a shared logic 56 (SL) can have common sub-expressions in their minterms. These common sub-expressions represent the same logic gates with same inputs, which are duplicated in separate blocks after the logic is mapped to a library.

Figure 9:
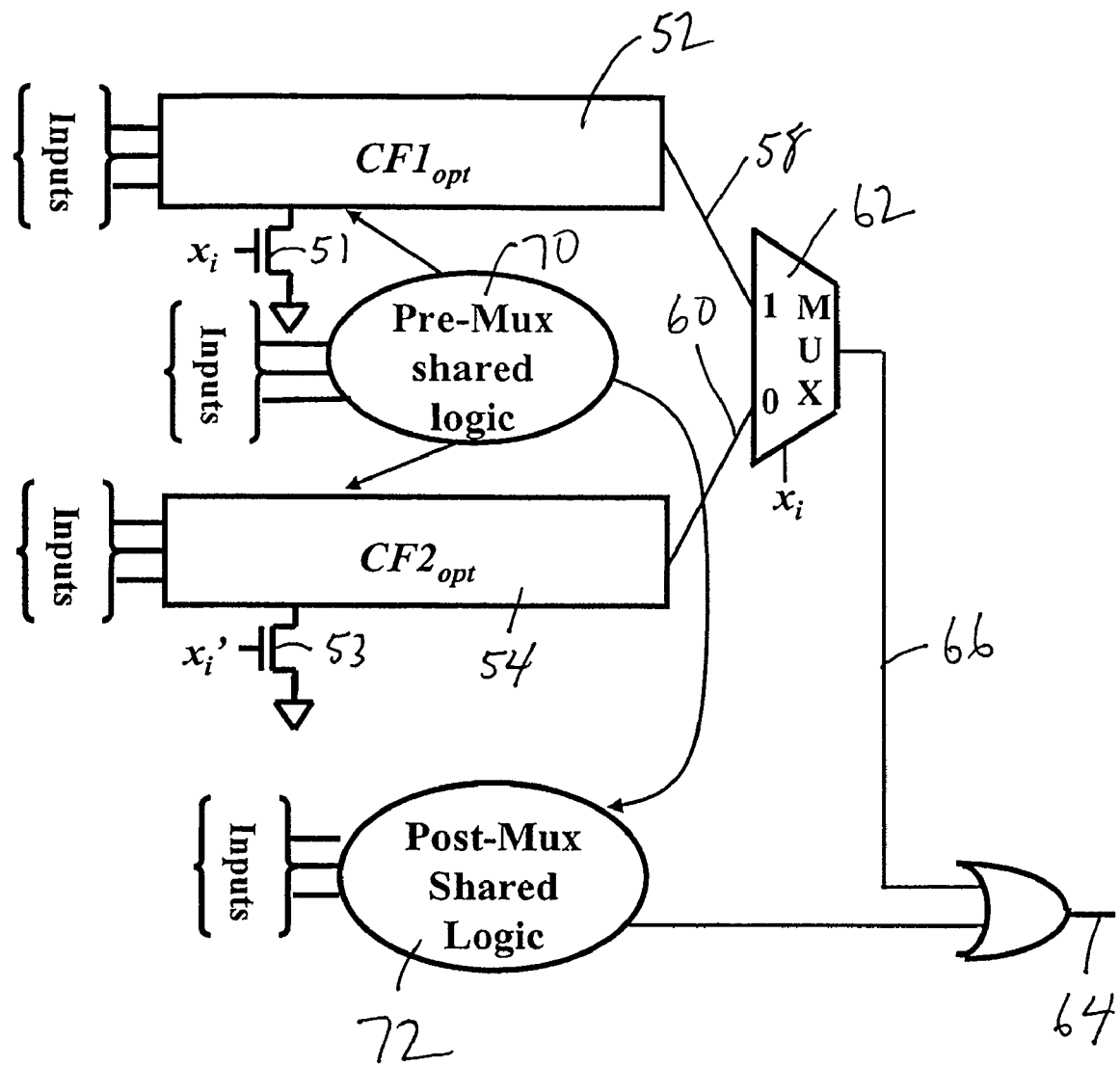
FIG. 9 illustrates a common sub-expression as shared logic without supply gating.

To further reduce the area, the common sub-expressions among CF1opt, CF2opt, and SL can be identified and shared. The shared sub-expressions common to CF1opt/CF2opt, CF1opt/SL and CF2opt/SL are moved to a Pre-MUX shared logic 70 as illustrated in FIG. 9. A new variable ($y_i$) is assigned to any shared sub-expression. In the above example, the common sub-expressions are as follows:

$y_1 = x_5x_6; y_2 = x_7x_8; y_3 = x_{10}x_{11}$

The remaining logic in SL after the sub-expression sharing is represented as Post-MUX shared logic 72 as shown in FIG. 9. The expressions CF1opt, CF2opt and Post-MUX are modified in terms of the new variables ($y_i$'s) as shown below for the above example:

$CF1opt = x_2' + y_1 + y_2; CF2opt = x_2 + x_3y_1 + y_3; SL = x_4y_2 + x_9y_2y_3$ The logic of the shared minterms ($y_i$'s) is implemented in Pre-MUX shared logic and provides outputs to CF1opt logic 52, CF2opt logic 54 and Post-MUX logic 72 as shown in FIG. 9. These blocks will be individually synthesized using the above expressions ($y_i$'s are treated as primary inputs).

3.3. Automated Synthesis Flow for Dynamic Supply Gating

The above-mentioned design methodology targets overall power reduction. It can be recursively applied for factoring of CF1opt, CF2opt and SL to further reduce power. However, there is some delay/area and switching energy overhead associated with added supply gating transistors and the multiplexer at each level of recursion. Beyond a certain number of recursion levels, the added overhead may offset the savings obtained by the above design methodology. Therefore, there can be an optimal number of levels (hierarchy) for recursive application of our design methodology to minimize power dissipation, while satisfying a given delay constraint.

Figure 10:
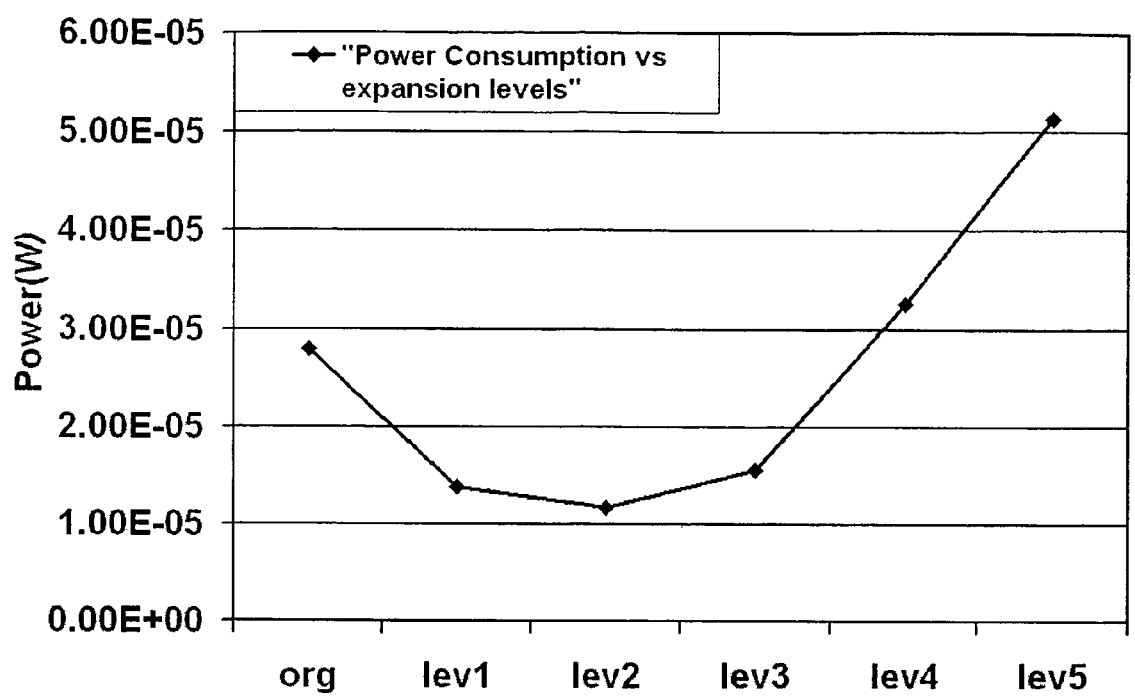
FIGS. 10A and 10B illustrate power consumption with increasing levels of circuit partitioning of a multiplexer and a cm150a benchmark circuits.
Figure 10B:
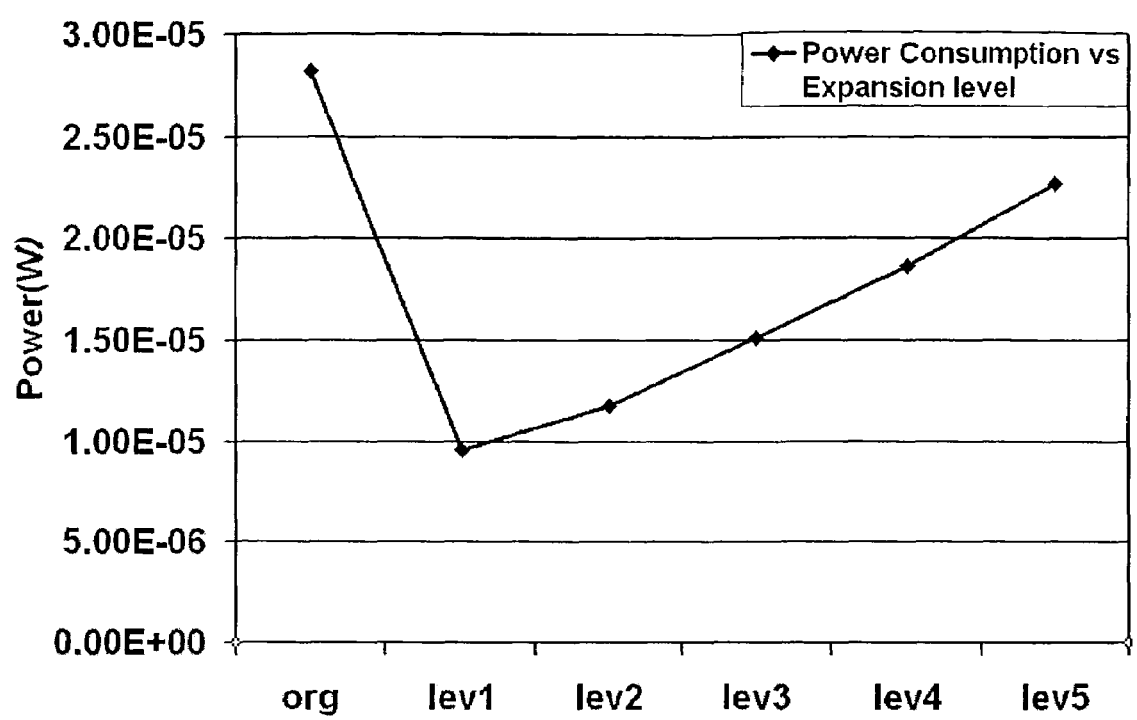

FIG. 10 shows the power consumption of the cm150a and mux benchmark circuits for five (5) levels of expansion. It can be seen that a reasonably optimal number of expansion levels are levels 2 and 1 for the mux of FIG. 10A and the cm150a of FIG. 10B benchmarks, beyond which power consumption has been found to increase.

3.4. Automated Synthesis Flow for Dynamic Supply Gating

Figure 11:
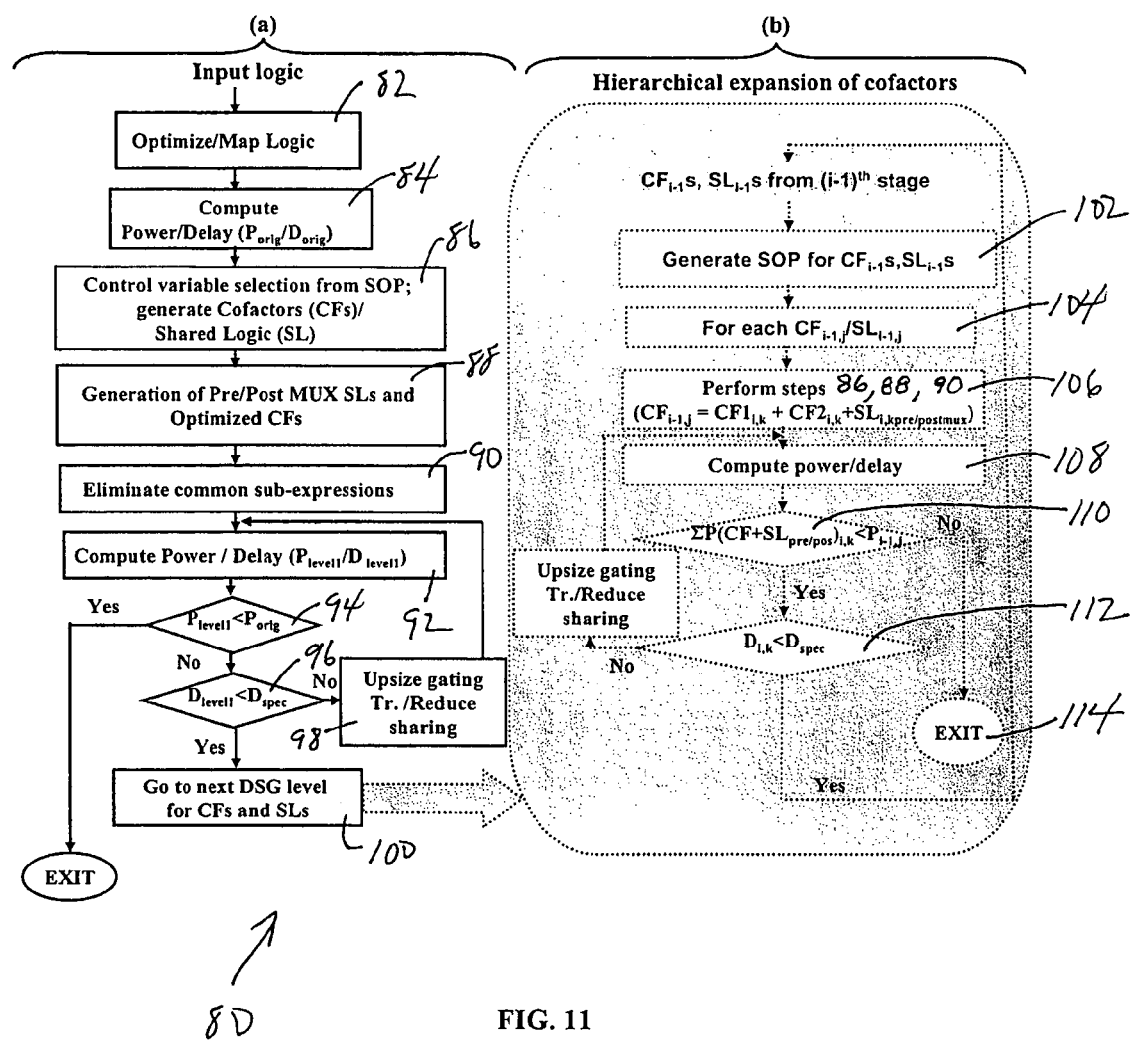
FIG. 11 is a flow chart illustrating a synthesis flow for dynamic supply gating.

In this section, an automated synthesis flow chart 80 for dynamic supply gating (DSG) using Shannon expansion is described. The automated synthesis flow chart 80 considers the optimization steps described in the previous sections. The synthesis flow chart 80 is shown in the FIG. 11. Part (a) of FIG. 11 represents an optimal synthesis flow for one level of DSG using Shannon expansion. Part (b) of FIG. 11 highlights an algorithm for recursive application of the method described in part (a) for multi-level expansion.

In part (a) of the flow chart 80, conventional logic optimization and synthesis step 82 is performed on the input Boolean expression and the resulting logic is technology-mapped to a gate library. Then, the resulting power and delay ($P_{orig}$ and $D_{orig}$) are estimated at step 84 using a graph representation of the optimized logic. The power estimated at step 84 is used to compare the power resulting from DSG synthesis flow to determine whether power saving is obtained by dynamic supply gating. The estimated delay is used to verify whether it satisfies the specified delay constraint.

Part (a) of the flow illustrates the steps of synthesis for DSG. The optimized logic function, which can include a multi-level format, obtained from step 82 is converted to a two-level format (sum-of-products or "SOP") in step 84. In step 86, the optimal control variable is identified and the corresponding cofactors (CF1 and CF2) and the shared logic (SL) are generated. The heuristic proposed to select the optimal control variable is discussed in detail in Section 3.5.

The cofactors and the shared logic (CF1, CF2 and SL) of step 86 are area optimized by utilizing the Common Sub-expression Elimination (CSE) described in Section 3.2. Then, the expressions of Pre-Mux shared logic, Post-Mux shared logic, CF1opt, and CF2opt are generated at step 88. After this optimization step, each of the logic functions (eg. CF1, CF2, SL) are separately synthesized and mapped to technology library at step 90. The individually synthesized functions are connected together with MUX and OR (See FIG. 8). The corresponding delay ($D_{level1}$) and power ($P_{level1}$) are estimated from a graph representation of the combined logic at step 92.

The estimated power ($P_{level1}$) is compared to that of the original design ($P_{orig}$) to evaluate the power saving. If it is found that $P_{level1}$ is less than $P_{orig}$ at step 94, then no power saving is achieved by DSG. Supply gating is not used for the current level of expansion and at step 96 the algorithmic ends. If there is power reduction at step 94, the delay ($D_{level1}$) is compared with the given delay constraint $D_{spec}$ at step 96 to determine whether the DSG synthesized circuit meets the delay requirement. If the delay constraint is not met, delay reduction methods such as upsizing supply gating transistors at step 98 and reducing logic sharing are applied and the power/delay conditions are rechecked at step 92. If both the power and delay conditions are satisfied at step 96, the circuit of current level of DSG is selected as the optimized output at step 100 at which point part (b) of the algorithmic FIG. 11 is utilized.

The recursive application of the DSG synthesis at multiple hierarchies is highlighted in part (b) of the flow chart of FIG. 11. At step 102, the sum-of-products is generated for $CF_{i-1}$s, $SL_{i-1}$s. At steps 104 and 106 after the generations of the sum-of-products at step 102, for each $CF_{i-1}$, $j/SL_{i-1}$,j, steps 86, 88, and 90 are performed. At step 108a: 1) comparison of the total power of its cofactors/shared logic circuits ($CF1_{1,k}$, $CF2_{1,k}$ and $SL_{1,k}$) with its original power consumption, and 2) a comparison of circuit delay with the delay constraint ($D_{spec}$) after expansion of $CF_{i-1}$j and application of supply gating to each of its cofactors is made. The decision to partition the $j^{th}$ cofactor at the hierarchy level 'i–1' (denoted by $CF_{i-1,j}$) is then made. If the power of the circuit consisting of the cofactors and the shared logic ($CF1_{i,k}$, $CF2_{i,k}$ and the $SL_{i,k}$) is less than $CF_{i-1,j}$ as determined at step 110 and the delay constraint is satisfied ($D(CF1_{i,k}, CF2_{i,k}$ and $SL_{i,k})<D_{spec}$), at step 112 DSG expansion is performed at that hierarchy level. Otherwise, the recursion stops at the level 'i–1' for that cofactor circuit ($CF_{i-1,j}$) at step 114.

3.5. Optimal Selection of Control Variable

In a circuit, the total power consists of both switching and leakage power. To estimate the total circuit power by its Boolean expression, the following assumptions are made:

All logic gates have the same average switching power denoted by $P_{sw}$ and the same average leakage power denoted by $P_{leak}$.

The number of logic gates after synthesis is proportional to the number of literals in the Boolean expression.

In a 2-level Boolean logic function, a particular input variable $x_i$ is associated with 'a' number of literals (whenever $x_i$ appears in one minterm, the other literals in the same minterm are counted) and its complement, $x_i'$, is associated with 'b' number of literals. The total number of literals is 'n'.

The signal probability of $x_i=1$ is $P_{xi}$. The switching probability of $x_i$ is $S_{xi}$.

The switching power of the gated transistor is $P_{GatingTr}$.

With the above assumptions, the power consumption of the circuit after applying Shannon expansion is estimated as follows:

$$P_{total} \approx \underbrace{[n-(a+b)](P_{sw}+P_{leak})}_{\text{Shared Logic Power}} + \underbrace{P_{xi}[a(P_{sw}+P_{leak})]}_{\text{CF1 Power(co-factor of } x_i)} +$$

$$\underbrace{(1-P_{xi})[b(P_{sw}+P_{leak})]}_{\text{CF2 Power(co-factor of } x_i')} + \underbrace{S_{xi} \cdot P_{\text{Gating\_Tr}}}_{\text{Gating Tr. Power}}$$

$$\approx [n-(a \cdot (1-P_{xi})+b \cdot P_{xi})](P_{sw}+P_{leak})+S_{xi} \cdot P_{\text{Gating\_Tr}}$$

As shown by the above formulation, with the knowledge of $P_{xi}$, $S_{xi}$ (from input signal statistics), a, b (from the Boolean function) and $P_{sw}$, $P_{leak}$, $P_{GatingTr}$ (from the library), a greedy algorithm can be implemented to search for the optimal input variable, which leads to minimum overall power after factorization and application of supply gating at a particular level. This variable is selected as the control variable to apply Shannon expansion to the Boolean equation.

3.6. Synthesis for Multiple Output Circuits

The DSG synthesis method can be extended to multi-output circuits by choosing a common control variable for all outputs at each level of expansion. For a multiple output circuit, all the minterms from every output expression can be initially combined to determine the control variable. Identical minterms can occur in the combined function (from the different output expressions) during the selection of the control variable. These identical minterms are counted only once, since in the circuit representation the circuit for this minterm is shared among all the outputs. After selection of the control variable, DSG synthesis is applied to determine the cofactors (CF1s and CF2s) and shared logic (SL) for all the output functions.

Figure 12:
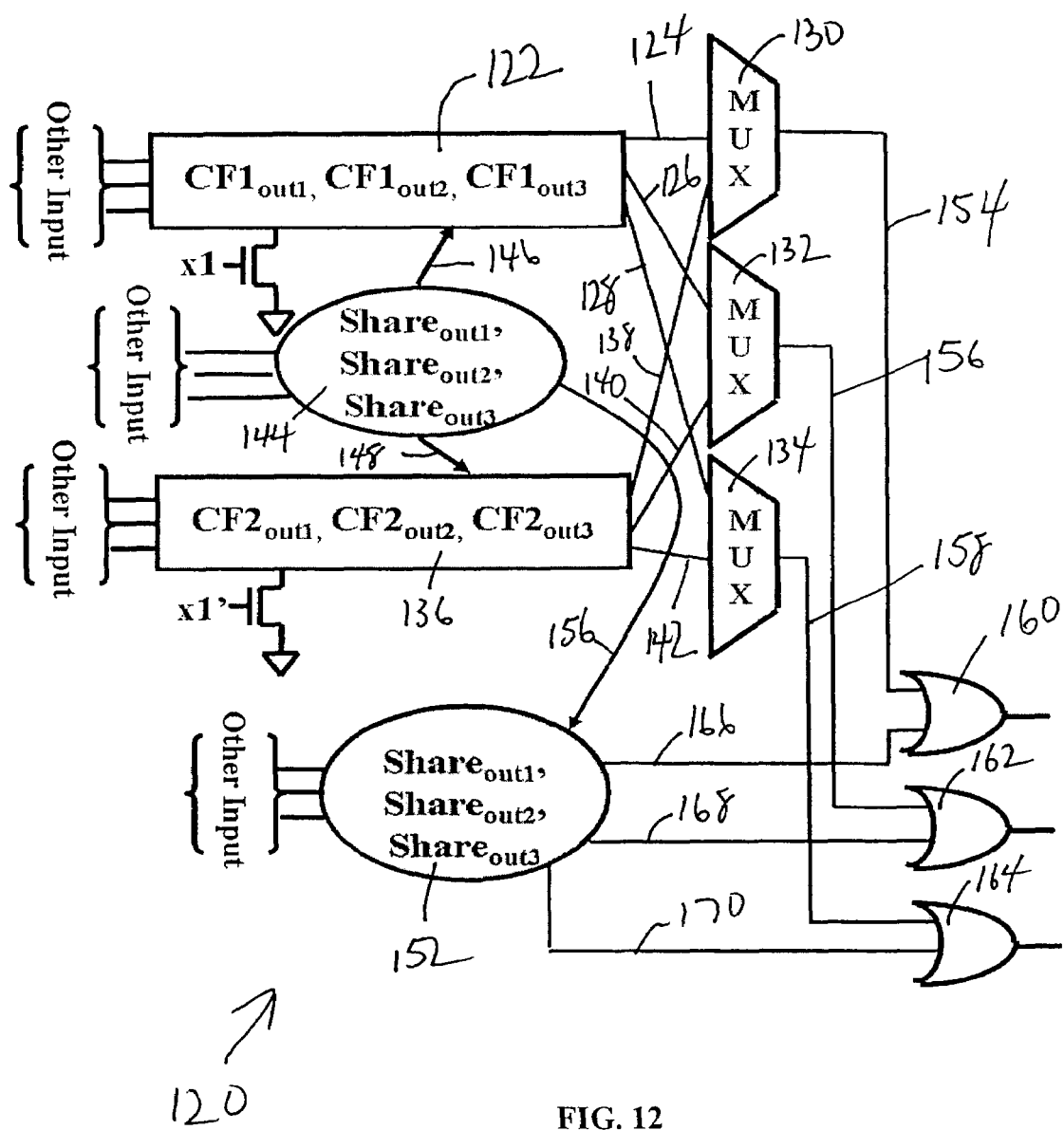
FIG. 12 illustrates a synthesis for a multioutput circuit.

A multi-output circuit 120 can be synthesized as illustrated in FIG. 12. Consider the 3-output circuit 120 described by the function:

$$Out_1 = x_1 x_2 x_3 + x_1' x_6 + x_2 x_4$$

$$Out_2 = x_1 x_2 x_3 + x_1' x_4 x_5 + x_5 x_6 + x_3 x_4$$

$$Out_3 = x_1 x_2 + x_1' x_4 x_3 + x_5 x_6$$

In the combined minterm representation, $x_1 x_2 x_3$ is present in expressions for both $Out_1$ and $Out_2$.

Therefore, it is counted only once in determining the control variable. Since the variable $x_1/x_1'$ is present in the largest number of minterms among all variables in the multi-output logic, $x_1$ is selected as the control variable. Applying DSG based synthesis to all the three logic expressions in terms of $x_1$:

$$CF1_{out1} = x_2 x_3;\ CF2_{out1} = x_6;\ SL_{out1} = x_2 x_4$$

$$CF1_{out2} = x_2 x_3;\ CF2_{out2} = x_4 x_5;\ SL_{out2} = x_5 x_6 + x_3 x_4$$

$$CF1_{out3} = x_2;\ CF2_{out3} = x_3 x_4;\ SL_{out3} = x_5 x_6$$

$CF1_{out1}$, $CF1_{out2}$, $CF1_{out3}$, and $CF2_{out1}$, $CF2_{out2}$, $CF2_{out3}$ are each synthesized conventionally as three output circuits, respectively, as shown in FIG. 12. The $CF1_{out1}$, $CF1_{out2}$, $CF1_{out3}$ circuit 122 includes first, second, and third outputs 124, 126, and 128 each coupled to respective inputs of respective multiplexers 130, 132, and 134. The $CF2_{out}$ circuit 136 includes first, second, and third outputs 138, 140 and 142 each coupled to respective inputs of multiplexers 130, 132, and 134. A shared terms circuit 144 includes outputs 146 and 148 coupled to the $CF1_{out}$ circuit 122 and the $CF2_{out}$ circuit 136. A third output 150 is coupled to a second shared terms circuit 152. Outputs 154, 156, and 158 are coupled to inputs of first, second, and third or gates 160, 162, and 164. Outputs 166, 168, and 170 of shared logic circuit 152 are coupled to inputs of the CR gates 160, 162, and 164. The individual blocks undergo a similar synthesis flow for next level of expansion as that of the single output case (see FIG. 11).

3.7. Pre-Computation of Supply Gating Control

Figure 13:
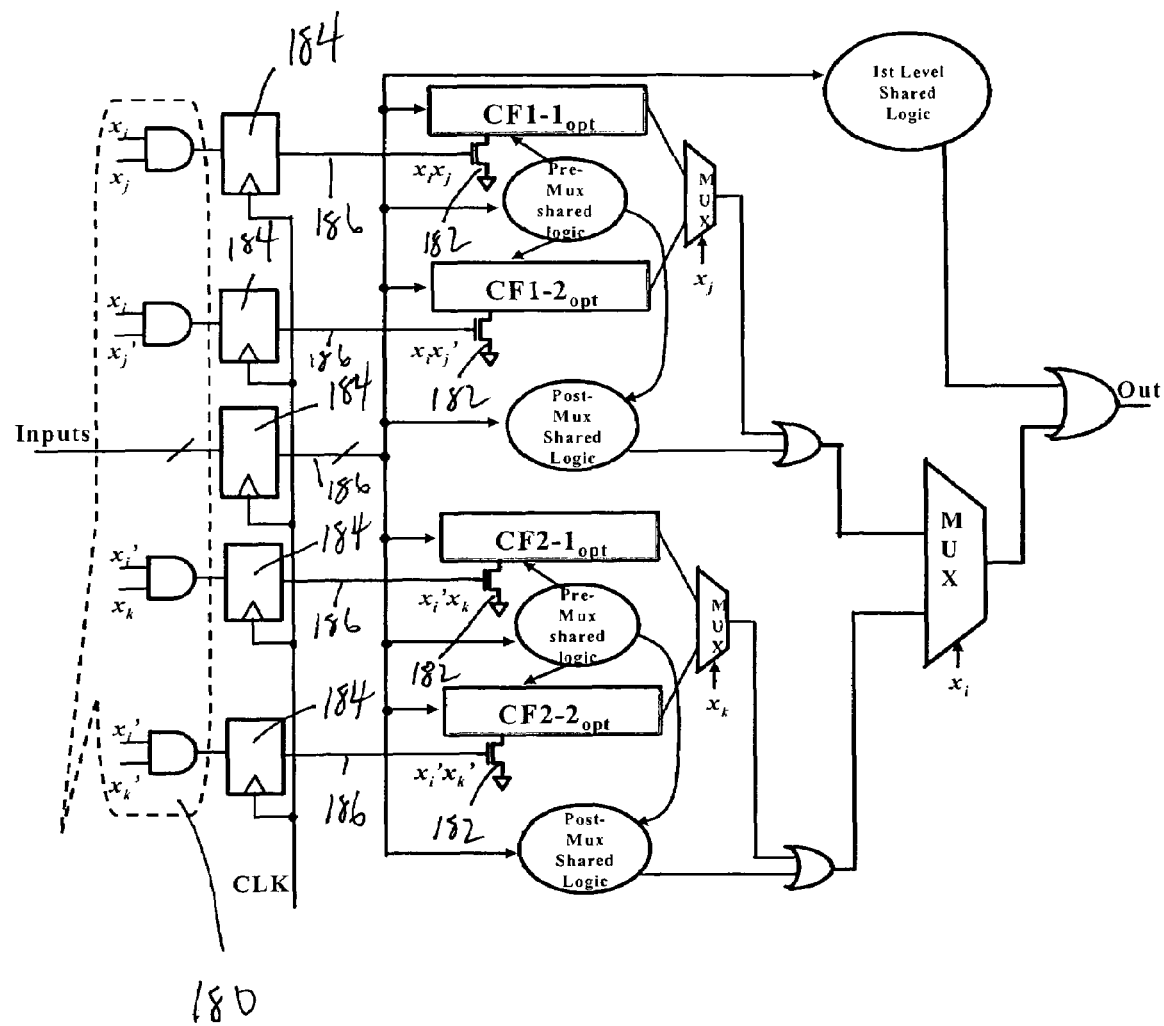
FIG. 13 illustrates a pre-computation scheme for a 2-level dynamic supply gating circuit.

The control signals of supply gating transistors are generated by decoding the selected control variables by the DSG synthesis flow. This decoding delay can become a critical part of the circuit delay if not properly hidden. That is because, the computation in a cofactor cannot start until the control signal of the supply gating transistor of that cofactor is decoded from the primary inputs and the gating transistor of that cofactor is turned on. Therefore, if the decoding delay is not hidden, it adds a considerable overhead to the circuit delay. In order to hide this decoding delay, a pre-decoding technique is used to compute the decoded control signals ahead of time so that the signals are ready at the same time as the primary inputs of cofactors. A pre-computation logic for a 2-level DSG circuit is shown in FIG. 13. The supply gating control signals are computed in the previous cycle and applied to one or more supply gating transistors 182 at the same time as the primary inputs. In addition to existing latches that capture the primary inputs, one or more respective latches 184 each have outputs 186 coupled to respective inputs of transistors 182. Latches 184 sample the pre-computed control signal. This does not add any significant hardware overhead since the number of required supply gating control signals is small compared to the number of primary inputs of the circuit.

3.8. Circuit Level Optimization of the Multiplexer

Figure 14:
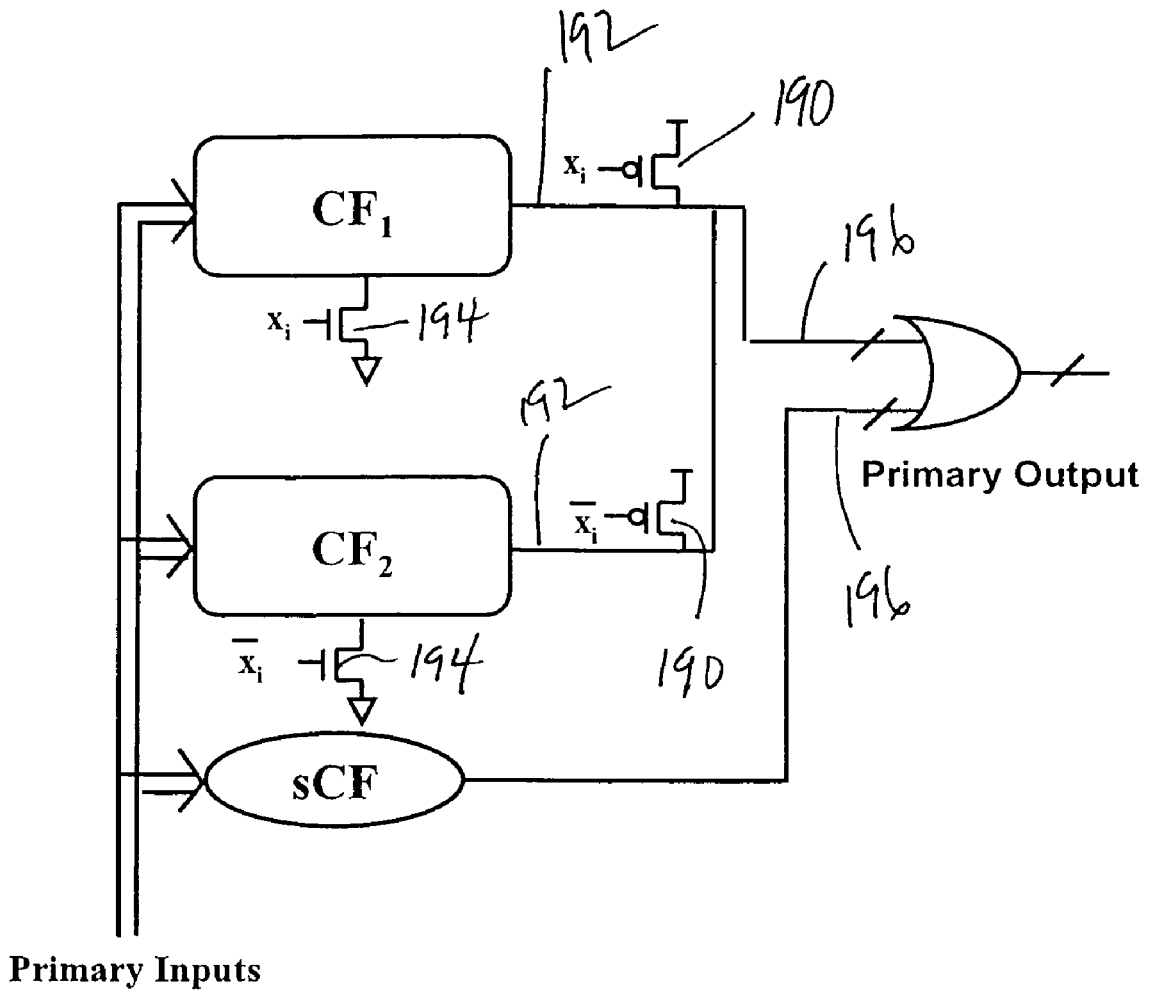
FIG. 14 illustrates a reduction in multiplexer area overhead by PMOS transistors at each cofactor output.

The area overhead incurred by inserting the multiplexer for every expansion level can be optimized by using a PMOS gating transistor 190 at each cofactor output 192 as shown in FIG. 14. The operation of the circuit is as follows:

Depending on the state of the control variable, the output of either the first or the second cofactor is computed. Suppose at some time instant the control variable $x_i$ is equal to '1'. The logic in cofactor CF1 gets computed since $x_i$ turns on a corresponding gating NMOS transistor 194. Since $x_i'$ is '0', the NMOS gating transistor 194 of CF2 is turned off and it does not switch. At the same time, the PMOS gating transistor 190 attached to the output 192 of CF1 is turned off and therefore the output of the first cofactor (CF1) is available at node 1. However, the PMOS transistor 190 present at the output of CF2 is switched on ($x_i'$='0') and charges the output of the CF2 to $V_{dd}$. Since the outputs of CF1 and CF2 form a wired-AND circuit, the computed output of CF1 is propagated to an OR-gate input 196 (the other input being '1'). Similar is the case when the $x_i'$ is equal to '1'. This technique significantly reduces the area overhead associated with the multiplexers since a minimum sized transistor can be utilized for the desired functioning of the circuit.

3.9. Reducing Wake-up Time of the Transistors

Figure 15:
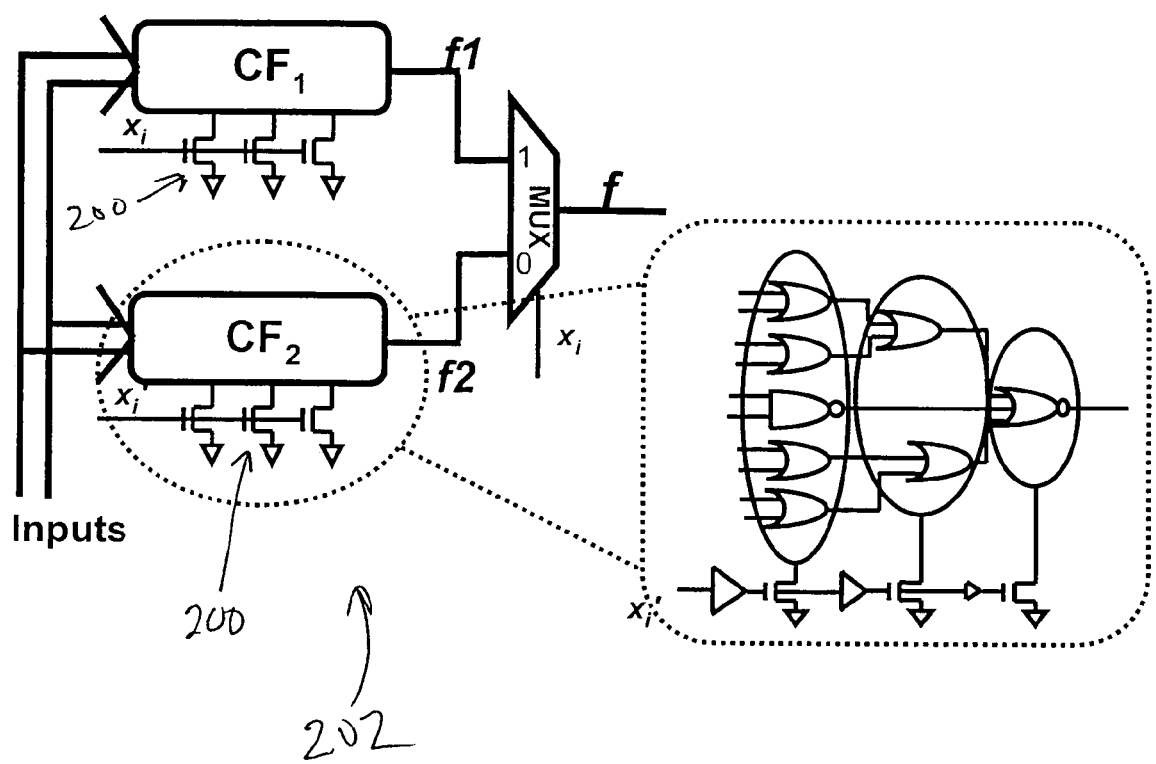
FIG. 15 illustrates separate gating transistors for each logic level.

The large capacitance associated with the "virtual ground" node of a single gating transistor added to each cofactor can result in an increase in their charging/discharging time (even if they are suitably sized) and increase the delay in operation of the whole circuit. This effect can be minimized by using a plurality gating transistors 200, for example one gating transistor for each level of logic 202 as shown in FIG. 15. The size of the gating transistors 200 can be determined by the number of gates present at each level. Since the capacitance at each of the "virtual ground" nodes are reduced, the switching happens faster for the supply gating transistors. Also, instead of using a single large driver as in the case of a single gating transistor, multiple drivers can be used to drive the gating transistor for each logic level (same area as single driver case). This can improve the "wake-up" time (delay in turning on the gating transistors since it has to discharge the virtual node capacitance) and switching power of the circuit. Simulations performed on a cm150a benchmark for a distributed gating transistor configuration shows about a 3% improvement in power and about a 5% improvement in delay compared to the single gating transistor for each cofactor. However, it should be noted that the routing of the control signals for the gating transistors in this case should be considered. The gating transistors at the first levels of logic in each cofactor can be turned on earlier than successive logic levels, so that the correct values can be propagated to the output. The circuit configuration 202 shown in FIG. 15 can be used to accomplish the above and also to reduce the effects of supply noise because the logic of successive levels is turned on in a pipelined fashion reducing the IR drop in the supply rails.

4.0. Experimental Results

To verify the effectiveness of the proposed dynamic supply gating synthesis approach, experiments are performed on a set of MCNC benchmark circuits. The synthesis tool has been integrated with SIS to perform logic optimization. The benchmarks in sum-of-products format are initially optimized by applying script.rugged several times. Inputs are assumed to be random (switching activity and signal probability of 0.5). The benchmarks are synthesized using the DSG synthesis flow (FIG. 11). For a basis of comparison, the benchmarks are also optimized for area using SIS (no supply gating). For accurate power estimation, after technology mapping to a standard cell library, the use of SPICE software and the resulting SPICE netlists are simulated using the NanoSim circuit simulation tool. The circuit delay and area are calculated using the Synopsys design compiler. The resulting netlists from both approaches are compared in terms of power, delay, and area as shown in Table 1 below.

TABLE 1

Experimental results (70 nm Process [10], Vdd = 1 V, Temp = 100 C.) (% numbers are percentages of (+) reduction, (−) increase)

| MCNC CKT | Power (µW) Conv. | Power (µW) DSG | Delay (ps) Conv. | Delay (ps) DSG | Area (µm²) Conv. | Area (µm²) DSG |
|---|---|---|---|---|---|---|
| count | 62.3 | 48.5 (+22.15%) | 64.7 | 558 (+13.75%) | 6150 | 5540 (+9.85%) |
| cm150a | 28.18 | 9.6 (+65.9%) | 92.8 | 72.6 (+21.73%) | 2940 | 2930 (+0.56%) |
| alu2 | 130.6 | 111.46 (+14.65%) | 542 | 462 (+14.76%) | 14600 | 15825 (−8.39) |
| alu4 | 384.1 | 351.5 (+8.48%) | 827 | 778 (+5.92%) | 41900 | 43129 (−2.93%) |
| mux | 27.8 | 13.9 (+50%) | 98.8 | 75.1 (+24%) | 3180 | 2650 (+16.94%) |
| Cht | 73.88 | 38.14 (+48.37%) | 16.8 | 15.2 (+9.49%) | 7200 | 7320 (−1.61%) |
| pcler8 | 32.5 | 28.6 (+12%) | 41.1 | 46.5 (−13.13%) | 4370 | 4480 (−2.5%) |
| pcle | 34.6 | 29.5 (+14.73%) | 36.8 | 42.2 (−14.67%) | 4270 | 4393 (−2.88%) |
| sct | 50.1 | 35.8 (+28.54%) | 41.8 | 34.6 (+17.22%) | 3260 | 3465 (−6.28%) |

The results show reduction of about 8% to 65% in total power, demonstrating the effectiveness of the DSG synthesis approach for low power design. The reductions in power can be attributed to both switching and leakage components of power dissipation. The delay incurred in the two configurations by activating the critical paths in the designs has been measured. However, the delay results vary across different benchmarks. This can be explained by considering the fact that the delay is determined by three factors:
  the average load at each internal node of the original and the Shannon-expanded circuit,
  the delay incurred in the supply gating transistors and the end multiplexer or the PMOS transistor (refer Section 3.2),
  the wiring delay penalty at each level of expansion.

The supply-gated configuration offers less loading on the internal nodes since the whole logic is divided into cofactors. However, there can be extra wiring overhead each time the circuit is partitioned by Shannon expansion. The critical path delays for the original and the Shannon-based circuits are enlisted in Table 1 for one level of circuit expansion. There is an area penalty for the Shannon expanded circuit because of the gating of the cofactors (by a transistor) and wiring overhead.

However, for some benchmarks it may happen that due to Shannon expansion, better logic optimization can be performed on the resulting cofactors that do not contain the control variable and hence total area reduces after expansion (reduces the wiring overhead too for some signals due to circuit partitioning). Area results, therefore, can depend on opportunities for logic sharing and common sub-expression elimination in different benchmarks to compensate for the overhead of supply gating transistors. However, the Shannon expansion method might not be optimal for relatively small circuits where the number of output signals can exceed the number of inputs by a large amount.

Consider the case of the MCNC benchmark, decod. It includes five inputs, sixteen outputs and consists of a total of 41 gates (original optimized circuit). After applying the described synthesis methodology to this circuit, it has been found that the power increase can be significant, about (50%), due to the switching overhead associated with the large number of multiplexers (one for each output). The area also increases by about 23% (53 gates). Since the circuit is relatively small, the switching of these multiplexers offsets the power savings obtained by reduction of redundant switching and leakage power. Therefore step 92 of FIG. 11 of the synthesis methodology returns the original circuit as the most optimal one.

Table 2 shows the power consumption, delay incurred and area overhead for multiple levels of expansion.

TABLE 2

Experimental results (70 nm Process [10], Vdd = 1 V, Temp = 100 C.) (% numbers are percentages of reduction)

| MCNC CKT | Optimum number of levels | Power (μW) Conv. | Power (μW) DSG | Delay (ns) Conv. | Delay (ns) DSG | Area (μm²) Conv. | Area (μm²) DSG |
|---|---|---|---|---|---|---|---|
| count | 1 | 62.3 | 48.5 (+22.15%) | 64.7 | 55.8 (+13.75%) | 6150 | 5540 (+9.85%) |
| cm150a | 1 | 28.18 | 9.6 (+65.9%) | 92.8 | 72.6 (+21.73%) | 2940 | 2930 (+0.56%) |
| alu2 | 1 | 130.6 | 111.46 (+14.65%) | 542 | 462 (+14.76%) | 14600 | 15825 (−8.39) |
| alu4 | 1 | 384.1 | 351.5 (+8.48%) | 827 | 778 (+5.92%) | 41900 | 43129 (−2.93%) |
| mux | 2 | 27.8 | 11.1 (+60%) | 98.8 | 59.9 (+39.36%) | 3180 | 3610 (−13.24%) |
| Cht | 3 | 73.88 | 30.6 (+58.58%) | 16.8 | 13.5 (+19.64%) | 7200 | 6920 (+3.9%) |
| pcler8 | 2 | 32.5 | 27.9 (+14.1%) | 41.1 | 49 (−19.22%) | 4370 | 4570 (−4.57%) |
| pcle | 2 | 34.6 | 28.7 (+17.05%) | 36.8 | 44.6 (−21.19%) | 4286 | 4479 (−4.5%) |
| sct | 2 | 50.1 | 33.7 (+32.73%) | 41.8 | 32.7 (+21.77%) | 3260 | 3680 (−12.88%) |

As predicted in Section 3.3, it can be observed that after a certain number of stages, not only there is a significant area overhead due to the addition of the gating transistor and the multiplexers, but the power consumption starts increasing as well. The optimum number of expansion levels for each circuit is shown in Table 2 along with their delay, power and area values.

The effect of different activities for the input signal for a single level of expansion has also been reviewed. The input signal activities were varied from 10% to 50% for a single level of expansion and the results are shown in Table 3.

TABLE 3

Experimental results (70 nm Process [10], Vdd = 1 V, Temp = 100 C.)

| MCNC benchmark | 10% Power (uW) Conv | 10% Power (uW) DSG | 20% Power (uW) Conv | 20% Power (uW) DSG | 30% Power (uW) Conv | 30% Power (uW) DSG | 40% Power (uW) Conv | 40% Power (uW) DSG | 50% Power (uW) Conv | 50% Power (uW) DSG |
|---|---|---|---|---|---|---|---|---|---|---|
| count | 49.45 | 48.1 | 53.1 | 51.2 | 56.4 | 54.2 | 59.9 | 55.2 | 62.3 | 48.5 |
| cm150a | 18.8 | 8.63 | 25.6 | 10.24 | 27.13 | 10.4 | 28.91 | 10.35 | 28.18 | 9.6 |
| alu2 | 77.17 | 70.5 | 93.1 | 80.2 | 108.3 | 93.7 | 120.9 | 103.1 | 130.6 | 111.46 |
| alu4 | 253.8 | 235.2 | 290.2 | 269.3 | 323.1 | 299.8 | 358.2 | 331.1 | 384.1 | 351.5 |
| mux | 15.9 | 10.59 | 20.2 | 12.9 | 22.7 | 13.9 | 25.02 | 14.8 | 27.8 | 13.9 |
| Cht | 49.7 | 32.1 | 60.7 | 38.3 | 68.3 | 41.5 | 72.4 | 39.93 | 73.88 | 38.14 |
| pcler8 | 20 | 20 | 38.3 | 25.7 | 47.1 | 27.8 | 55.1 | 29.8 | 32.5 | 28.6 |
| pcle | 14.13 | 14.13 | 37.9 | 19.9 | 48.2 | 26.9 | 56.1 | 30.8 | 34.6 | 29.5 |
| sct | 26.1 | 24 | 35.2 | 31.7 | 41.7 | 35.9 | 45.8 | 38.6 | 50.1 | 35.8 |

It is evident that the reduced activity at the primary inputs reduces the activity in the overall circuit. Therefore, the leakage power in the active mode of the circuit increases. The gating transistor in the partitioned design provides stacking effect and reduces this leakage power as well. The magnitude of power reduction, however, depends on the power reduction due to both redundant switching (which also reduces with reduced activity) and leakage power.

To evaluate the effectiveness of the design methodology, the original and Shannon-expanded (1-level) "mux" benchmark circuit was designed using IBM 130 nm technology. The power/critical path delay results from the extracted Hspice netlists and the area results from the layout are summarized in Table 4.

TABLE 4

Measurement results (130 nm IBM Process, Vdd = 1.2 V, Temp = 100 C.) (% numbers are percentages of reduction)

| MCNC CKT | Power (μW) | | Delay (ns) | | Area (μm²) | |
|---|---|---|---|---|---|---|
| | Conv. | DSG | Conv. | DSG | Conv. | DSG |
| mux | 35.5 | 21.3 (+40%) | 110.1 | 89.18 (+19%) | 5360 | 4760 (+11.19%) |

A low-overhead design methodology that reduces active leakage and/or and switching power using dynamic supply gating has been described. A logic synthesis approach based on Shannon expansion has also been described that dynamically applies supply gating to idle parts of general logic circuits during active mode of operation. The described techniques result in automatic leakage power reduction in the standby mode as well. Reduction of redundant computations of the idle part of the circuit is also described. Experimental results on a set of MCNC benchmarks illustrates power saving in scaled technologies.

While the invention has been illustrated and described in detail in the drawings and foregoing description, the same is to be considered as illustrative and not restrictive in character, it being understood that preferred embodiments have been shown and described and that all changes and modifications that come within the spirit of the invention are desired to be protected.

What is claimed is:

1. A method to control the amount of power used by a combinational logic circuit implementing a logic function, the method comprising the steps of:
   converting the logic function to a sum of at least two sub-functions, to determine an idle portion of the logic circuit and to determine an active portion of the logic circuit according to the Shannon expansion method, wherein one of the at least two sub-functions includes a first control variable and a first cofactor and the other of the at least two sub-functions includes a second control variable and a second cofactor;
   providing a logic circuit including the idle portion and the active portion and a first cofactor circuit based on the first cofactor and a second cofactor circuit based on the second cofactor;
   providing a first control gate coupled to the first cofactor circuit and a second control gate coupled to the second cofactor circuit;
   disconnecting the power from the idle portion of the circuit; and
   connecting the power to the active portion of the circuit while the power is disconnected from the idle portion of the circuit.

2. The method of claim 1, wherein the step of providing the first control gate and the second control gate comprises the first control gate having an input to receive a signal determined according to the state of one of the first cofactor and the second cofactor and the second control gate having an input to receive a signal determined according to the state of the other of the first cofactor and the second cofactor.

3. The method of claim 1, wherein the first cofactor circuit includes a first cofactor output and the second cofactor circuit includes a second cofactor output.

4. The method of claim 3, further comprising the step of providing a multiplexer, coupled to the first cofactor output and to the second cofactor output, the multiplexer having a multiplexer output to provide a signal based one of the signals of the first cofactor output and the second cofactor output.

5. A method to control the amount of power used by a combinational logic circuit implementing a logic function, the method comprising the steps of:
   converting the logic function to a sum of at least two sub-functions, to determine an idle portion of the logic circuit and to determine an active portion of the logic circuit according to the Shannon expansion method, wherein one of the at least two sub-functions includes a first control variable and a first cofactor and the other of the at least two sub-functions includes a second control variable and a second cofactor;
   identifying one or more minterms not including either of the first cofactor and second cofactor;
   providing a logic circuit including the idle portion and the active portion;
   disconnecting the power from the idle portion of the circuit;
   connecting the power to the active portion of the circuit while the power is disconnected from the idle portion of the circuit; and
   further comprising the step of optimizing the logic function prior to the step of converting the logic function to the sum of two sub-functions, to provide a logic function having a minimized number of literals.

6. The method of claim 5, wherein the providing step comprises providing a logic circuit having a first cofactor circuit based on the first cofactor, a second cofactor circuit based on the second cofactor, and a shared logic circuit based on the identified one or more minterms.

7. A method of providing a combinational logic circuit implementing a logic function, the circuit including a reduced power requirement, the method comprising the steps of:
   optimizing the logic function;
   converting the optimized logic function to a two-level format;
   identifying a control variable, a first cofactor, and a second cofactor from the two level format;
   eliminating a common sub-expression after the identifying step to eliminate a duplicate logic function;
   estimating one or both of an original power and original delay of the optimized logic function
   estimating an estimated power after the eliminating step;
   comparing the original power to the estimated power to determine whether the identified first cofactor and second cofactor have reduced power;
   mapping the first cofactor to provide a first logic circuit including a first output;
   mapping the second cofactor to provide a second logic circuit including a second output; and
   coupling the first output and the second output to a selector, to select from one of the first and second outputs.

8. The method of claim 7 wherein the selector of the coupling step comprises a multiplexer.

9. The method of claim 7, wherein the converting step comprises converting the optimized logic function to a two-level format by applying a Shannon expansion.

10. The method of claim 9, wherein the applied Shannon expansion provides a logic function including a control variable, a first cofactor and a second cofactor.

11. The method of claim 7, wherein the comparing step includes providing a combination logic circuit having reduced power with the first logic circuit and the second logic circuit.

12. The method of claim 7, further comprising the step of estimating an estimated delay after the eliminating step.

13. The method of claim 12, further comprising the step of comparing a specified delay to the estimated delay to determine whether the identified first cofactor and second cofactor have reduced delay.

14. The method of claim 13, further comprising providing a control gate having a size selected according to the result of the delay comparing step.

15. The method of claim 7, further comprising repeating the identifying step to determine whether a further reduced power can be achieved.

* * * * *